US010341054B2

(12) United States Patent
Hwang

(10) Patent No.: US 10,341,054 B2
(45) Date of Patent: Jul. 2, 2019

(54) APPARATUS AND METHOD FOR SENDING/RECEIVING PACKET IN MULTIMEDIA COMMUNICATION SYSTEM

(71) Applicant: Samsung Electronics Co., Ltd., Suwon-si, Gyeonggi-do (KR)

(72) Inventor: Sung-Hee Hwang, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 14/906,183

(22) PCT Filed: Jul. 18, 2014

(86) PCT No.: PCT/KR2014/006549
§ 371 (c)(1),
(2) Date: Jan. 19, 2016

(87) PCT Pub. No.: WO2015/009105
PCT Pub. Date: Jan. 22, 2015

(65) Prior Publication Data
US 2016/0182188 A1 Jun. 23, 2016

(30) Foreign Application Priority Data
Jul. 18, 2013 (KR) .................. 10-2013-0084877

(51) Int. Cl.
*H04L 12/26* (2006.01)
*H04L 1/00* (2006.01)
(Continued)

(52) U.S. Cl.
CPC .......... *H04L 1/0075* (2013.01); *H03M 13/27* (2013.01); *H03M 13/29* (2013.01);
(Continued)

(58) Field of Classification Search
CPC .................................................... H04L 1/0075
(Continued)

(56) References Cited

U.S. PATENT DOCUMENTS 5,594,736 A * 1/1997 Tatsumi ................ H04N 19/40
348/231.6
2003/0212943 A1 11/2003 Zhang
(Continued)

FOREIGN PATENT DOCUMENTS

CN 102469311 A 5/2012
JP 2008-160499 A 7/2008
(Continued)

OTHER PUBLICATIONS

Systems/MMT, Technologies Under Consideration (TuC) for MMT, International Organisation for Standardisation, Coding of Moving Pictures and Audio, Dec. 3, 2011, ISO/IEC JTC1/SC29/WG11 N12335, XP030018830, Geneva Switzerland.
(Continued)

*Primary Examiner* — Christopher S Kelley
*Assistant Examiner* — Asmamaw G Tarko
(74) *Attorney, Agent, or Firm* — Jefferson IP Law, LLP

(57) ABSTRACT

A method for sending forward error correction (FEC) configuration information by a sending apparatus in a multimedia system is provided. The method includes sending source FEC configuration information for an FEC source packet to a receiving apparatus, wherein the source FEC configuration information includes information related to an FEC source or repair packet that is sent first among at least one FEC source or repair packet if an FEC source or repair packet block includes the at least one FEC source or repair packet.

7 Claims, 16 Drawing Sheets

(51) Int. Cl.
*H04L 29/06* (2006.01)
*H03M 13/27* (2006.01)
*H03M 13/29* (2006.01)
*H03M 13/35* (2006.01)
*H03M 13/11* (2006.01)
*H03M 13/15* (2006.01)
*H03M 13/23* (2006.01)

(52) U.S. Cl.
CPC ..... *H03M 13/2906* (2013.01); *H03M 13/353* (2013.01); *H04L 1/00* (2013.01); *H04L 43/106* (2013.01); *H04L 65/4076* (2013.01); *H03M 13/1102* (2013.01); *H03M 13/1515* (2013.01); *H03M 13/23* (2013.01)

(58) Field of Classification Search
USPC .................................................. 375/240.27
See application file for complete search history.

(56) References Cited

U.S. PATENT DOCUMENTS

| | | | |
|---|---|---|---|
| 2007/0204196 A1 | 8/2007 | Watson et al. | |
| 2008/0049846 A1* | 2/2008 | Nagafuji | H04N 21/4305 375/240.28 |
| 2008/0151776 A1* | 6/2008 | Kure | H04L 1/0007 370/253 |
| 2009/0201805 A1 | 8/2009 | Begen et al. | |
| 2009/0225791 A1* | 9/2009 | Nagafuji | H04L 1/0045 370/509 |
| 2010/0050057 A1 | 2/2010 | Luby | |
| 2011/0119546 A1* | 5/2011 | Ver Steeg | H04N 21/6437 714/748 |
| 2011/0289540 A1 | 11/2011 | Yachida | |
| 2012/0131407 A1* | 5/2012 | Chiao | H03M 13/356 714/751 |
| 2012/0297274 A1 | 11/2012 | Zhang | |
| 2013/0013982 A1* | 1/2013 | Hwang | H03M 13/05 714/776 |

FOREIGN PATENT DOCUMENTS

| | | | |
|---|---|---|---|
| JP | 2008160499 A | * | 7/2008 |
| JP | 2010-187097 A | | 8/2010 |
| JP | 2013-192031 A | | 9/2013 |

OTHER PUBLICATIONS

Information technology—High efficiency coding and media delivery in heterogeneous environments—Part 1: MPEG media transport (MMT), Jul. 20, 2012, pp. 1-69, XP008179243, ISO/IEC JTC 1/SC 29 N, ISO/IEC CD 23008-1.

Hwang et al., Proposed FEC Timestamp for HRBM, International Organisation for Standardisation, ISO/IEC JTC1/SC29/WG11, Jul. 2013, XP030058743, Vienna, Austria.

Information technology—™—High efficiency coding and media delivery in heterogeneous environments—Part 1: MPEG media transport (MMT), ISO/IEC FDIS 23008-1, ISO/IEC JTC1/SC 29, Apr. 26, 2013, XP030020724.

Chinese Office Action dated Mar. 7, 2018, issued in Chinese Application No. 201480040849.X.

Japanese Office Action dated Mar. 6, 2018, issued in Japanese Application No. 2016-527939.

Japanese Notice of Allowance; Draft Date Apr. 24, 2019; Dispatch Date May 7, 2019; Patent Application #: 2016-527939.

* cited by examiner

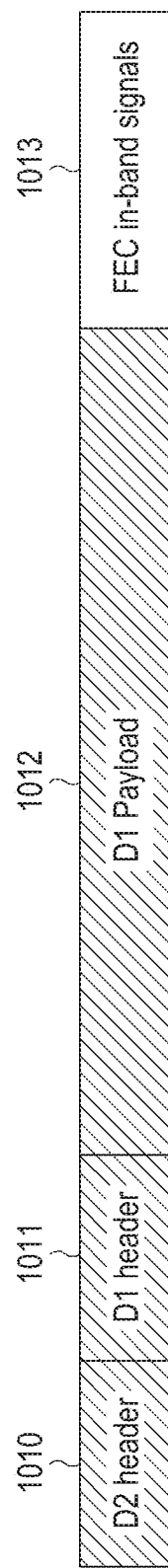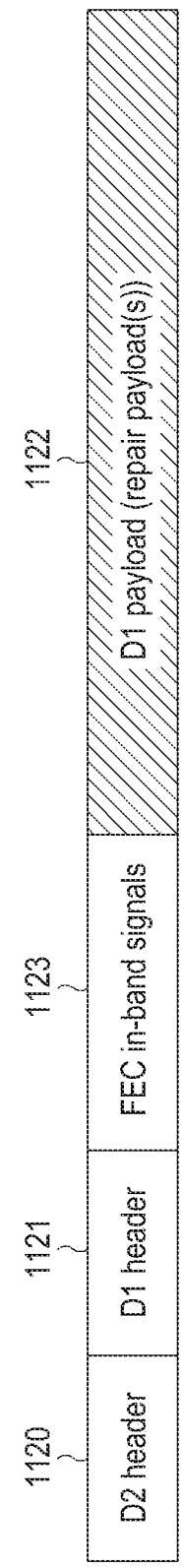
FIG. 10
FIG. 11

APPARATUS AND METHOD FOR SENDING/RECEIVING PACKET IN MULTIMEDIA COMMUNICATION SYSTEM

CROSS-REFERENCE TO RELATED APPLICATION(S)

This application is a U.S. National Stage application under 35 U.S.C. § 371 of an International application filed on Jul. 18, 2014 and assigned application number PCT/KR2014/006549, which claimed the benefit of a Korean patent application filed on Jul. 18, 2013 in the Korean Intellectual Property Office and assigned Serial number 10-2013-0084877, the entire disclosure of which is hereby incorporated by reference.

TECHNICAL FIELD

The present disclosure relates to an apparatus and method for sending/receiving a packet in a multimedia communication system. More particularly, the present disclosure relates to an apparatus and method for sending/receiving a packet in a multimedia communication system supporting a forward error correction (FEC) scheme.

BACKGROUND

Various multimedia technologies have been proposed according to increase of demands for multimedia, a typical multimedia technology is a moving picture experts group (MPEG) media transport (MMT) technology.

The MMT technology is a technology for transport and delivery of coded media data for multimedia services over heterogeneous packet-switched networks including internet protocol (IP) networks and digital broadcasting networks. The coded media data includes timed audiovisual media data and non-timed data.

In the MMT technology, the coded media data will be delivered over a packet-switched delivery network. In the MMT technology, characteristics of delivery environment, e.g., non-constant end-to-end delay of each packet from an MMT sending entity to an MMT receiving entity, and the like is considered.

For efficient and effective delivery and consumption of the coded media data over the packet-switched delivery networks, the MMT technology provides the following elements, and this will be described below.

Firstly, the MMT technology provides a logical model to construct contents composed of components from various sources, e.g., components of mash-up applications, and the like.

Secondly, the MMT technology provides formats to deliver information about the coded media data to enable delivery layer processing such as packetization.

Thirdly, the MMT technology provides a packetization method and a structure of a packet to deliver a media content over packet-switched networks supporting media and coding independent hybrid delivery over multiple channels.

Fourthly, the MMT technology provides a format of signaling messages to manage delivery and consumption of a media content.

According to diversification of contents and increases in large-capacity contents such as high definition (HD) contents and ultra high definition (UHD) contents in a multimedia communication system supporting an MMT scheme, data congestion has become more serious on a network. Due to such a condition, contents sent by a signal sending device, e.g., a host A is not completely transferred to a signal reception device, e.g., a host B and some of the contents are lost en route.

In general, data is sent on a packet basis, and accordingly data loss is generated on a sending packet basis. Accordingly, if the sending packet is lost on a network, the signal reception device cannot receive the lost sending packet, and thus cannot know data within the lost sending packet. As a result, a user may be inconvenienced. For example, the user may experience audio signal quality deterioration, video picture quality deterioration, video picture break, caption omission, file loss, and the like.

In view of the above, there is a need for a scheme for repairing data loss occurred on a network.

If data is lost on the network, one of schemes which support repair of data lost in a signal reception apparatus is a scheme in which a source block is generated using a preset number of data packets which may have various lengths referred to as a source packet, repair information including information such as, for example, parity data or a repair packet is added to the source block through a forward error correction (FEC) encoding, and the source block to which the repair information is added is sent on a packet block basis.

So, a signal receiving apparatus needs repair delay time corresponding to preset time which is used for sending the packet block in the signal sending apparatus in order to repair data loss.

There is a need for a hypothetical receiver buffering model (HRBM) as a buffering model of a hypothetical signal receiving apparatus in order to repair data loss by combining a de-jittering scheme as a scheme of removing a packet jitter which occurs on a network and an FEC scheme, so a case that the signal receiving apparatus considers to perform a data loss repair operation and a de-jittering operation using the HRBM occurs.

However, there is no scheme of effectively performing the data loss repair operation and the de-jittering operation using the HRBM in a current multimedia communication system supporting an MMT scheme.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method and apparatus for sending/receiving a packet in a multimedia communication system supporting a forward error correction (FEC) scheme.

Another aspect of the present disclosure is to provide a method and apparatus for sending/receiving a packet thereby increasing data recover efficiency in a multimedia communication system supporting an FEC scheme.

Another aspect of the present disclosure is to provide a method and apparatus for sending/receiving a packet thereby acquiring efficient transmission reliability in a multimedia communication system supporting an FEC scheme.

Another aspect of the present disclosure is to provide a method and apparatus for sending/receiving a packet by considering a characteristic of the packet in a multimedia communication system supporting an FEC scheme.

Another aspect of the present disclosure is to provide a method and apparatus for sending/receiving a packet by considering an FEC coding structure in a multimedia communication system supporting an FEC scheme.

Another aspect of the present disclosure is to provide a method and apparatus for sending/receiving a packet by considering a packet sending timing point in a multimedia communication system supporting an FEC scheme.

Another aspect of the present disclosure is to provide a method and apparatus for sending/receiving a packet by considering a split characteristic of the packet in a multimedia communication system supporting an FEC scheme.

Another aspect of the present disclosure is to provide a method and apparatus for sending/receiving a packet by considering delay between a signal sending apparatus and a signal receiving apparatus in a multimedia communication system supporting an FEC scheme.

Another aspect of the present disclosure is to provide a method and apparatus for sending/receiving a packet by considering a buffer size in a multimedia communication system supporting an FEC scheme.

An aspect of the present disclosure is to provide a method and apparatus for sending/receiving FEC configuration information related to an FEC scheme in a multimedia communication system supporting the FEC scheme.

In accordance with an aspect of the present disclosure, a method for sending FEC configuration information by a sending apparatus in a multimedia system is provided. The method includes sending source FEC configuration information for an FEC source packet to a receiving apparatus, wherein the source FEC configuration information includes information related to an FEC source or repair packet that is sent first among at least one FEC source or repair packet if an FEC source or repair packet block includes the at least one FEC Source or Repair packet.

In accordance with another aspect of the present disclosure, a method for receiving FEC configuration information by a receiving apparatus in a multimedia system is provided. The method includes receiving source FEC configuration information for an FEC source packet from a sending apparatus, wherein the source FEC configuration information includes information related to an FEC source or repair packet that is sent first among at least one FEC source or repair packet if an FEC source or repair packet block includes the at least one FEC source or repair packet.

In accordance with another aspect of the present disclosure, a sending apparatus in a multimedia system is provided. The sending apparatus includes a sender configured to send source FEC configuration information for an FEC source packet to a receiving apparatus, wherein the source FEC configuration information includes information related to an FEC source or repair packet that is sent first among at least one FEC source or repair packet if an FEC source or repair packet block includes the at least one FEC Source or Repair packet.

In accordance with another aspect of the present disclosure, t a receiving apparatus in a multimedia system is provided. The receiving apparatus includes a receiver configured to receive source FEC configuration information for an FEC source packet from a sending apparatus, wherein the source FEC configuration information includes information related to an FEC source or repair packet that is sent first among at least one FEC source or repair packet if an FEC source or repair packet block includes the at least one FEC source or repair packet.

As is apparent from the foregoing description, an embodiment of the present disclosure enables to send/receive a packet thereby decreasing recover delay which may occur in a signal receiving apparatus due to delay time due to packet encoding and packet delay time on a network in a multimedia communication system supporting an FEC scheme.

An embodiment of the present disclosure enables to send/receive a packet thereby increasing data recover efficiency in a multimedia communication system supporting an FEC scheme.

An embodiment of the present disclosure enables to send/receive a packet thereby acquiring efficient transmission reliability in a multimedia communication system supporting an FEC scheme.

An embodiment of the present disclosure enables to send/receive a packet by considering a characteristic of the packet in a multimedia communication system supporting an FEC scheme.

An embodiment of the present disclosure enables to send/receive a packet by considering an FEC coding structure in a multimedia communication system supporting an FEC scheme.

An embodiment of the present disclosure enables to send/receive a packet by considering a packet sending timing point in a multimedia communication system supporting an FEC scheme.

An embodiment of the present disclosure enables to send/receive a packet by considering a split characteristic of the packet in a multimedia communication system supporting an FEC scheme.

An embodiment of the present disclosure enables to send/receive a packet by considering delay between a signal sending apparatus and a signal receiving apparatus in a multimedia communication system supporting an FEC scheme.

An embodiment of the present disclosure enables to send/receive a packet by considering a buffer size in a multimedia communication system supporting an FEC scheme.

An embodiment of the present disclosure enables to send/receive FEC configuration information related to an FEC scheme in a multimedia communication system supporting the FEC scheme.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 10 schematically illustrates a structure of an FEC source packet which is used in an MMT system supporting an FEC scheme according to an embodiment of the present disclosure;

FIG. 11 schematically illustrates a structure of an FEC repair packet which is used in an MMT system supporting an FEC scheme according to an embodiment of the present disclosure;

Throughout the drawings, it should be noted that like reference numbers are used to depict the same or similar elements, features, and structures.

DETAILED DESCRIPTION

Figure 1:
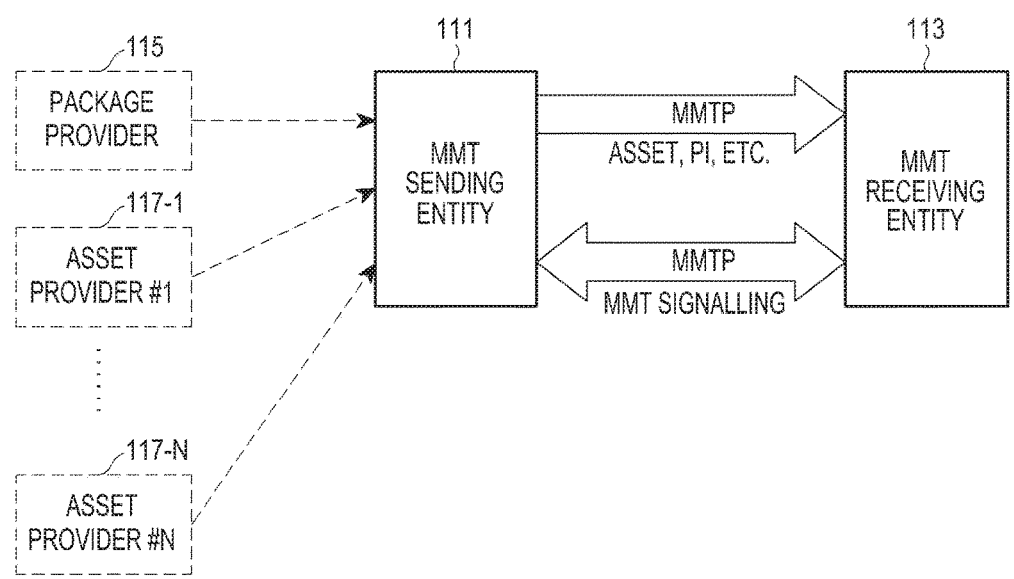
FIG. 1 schematically illustrates an example of a structure of a moving picture experts group (MPEG) media transport (MMT) system supporting an forward error correction (FEC) scheme according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Although ordinal numbers such as "first," "second," and so forth will be used to describe various components, those components are not limited herein. The terms are used only for distinguishing one component from another component. For example, a first component may be referred to as a second component and likewise, a second component may also be referred to as a first component, without departing from the teaching of the inventive concept. The term "and/or" used herein includes any and all combinations of one or more of the associated listed items.

The terminology used herein is for the purpose of describing various embodiments only and is not intended to be limiting. As used herein, the singular forms are intended to include the plural forms as well, unless the context clearly indicates otherwise. It will be further understood that the terms "comprises" and/or "has," when used in this specification, specify the presence of a stated feature, number, operation, component, element, or combination thereof, but do not preclude the presence or addition of one or more other features, numbers, operations, components, elements, or combinations thereof.

The terms used herein, including technical and scientific terms, have the same meanings as terms that are generally understood by those skilled in the art, as long as the terms are not differently defined. It should be understood that terms defined in a generally-used dictionary have meanings coinciding with those of terms in the related technology.

According to various embodiments of the present disclosure, an electronic device may include communication functionality. For example, an electronic device may be a smart phone, a tablet personal computer (PC), a mobile phone, a video phone, an e-book reader, a desktop PC, a laptop PC, a netbook PC, a personal digital assistant (PDA), a portable multimedia player (PMP), an mp3 player, a mobile medical device, a camera, a wearable device (e.g., a head-mounted device (HMD), electronic clothes, electronic braces, an electronic necklace, an electronic appcessory, an electronic tattoo, or a smart watch), and/or the like.

According to various embodiments of the present disclosure, an electronic device may be a smart home appliance with communication functionality. A smart home appliance may be, for example, a television, a digital versatile disk (DVD) player, an audio, a refrigerator, an air conditioner, a vacuum cleaner, an oven, a microwave oven, a washer, a dryer, an air purifier, a set-top box, a TV box (e.g., Samsung HomeSync™, Apple TV™, or Google TV™), a gaming console, an electronic dictionary, an electronic key, a camcorder, an electronic picture frame, and/or the like.

According to various embodiments of the present disclosure, an electronic device may be a medical device (e.g., magnetic resonance angiography (MRA) device, a magnetic resonance imaging (MRI) device, computed tomography (CT) device, an imaging device, or an ultrasonic device), a navigation device, a global positioning system (GPS) receiver, an event data recorder (EDR), a flight data recorder (FDR), an automotive infotainment device, a naval electronic device (e.g., naval navigation device, gyroscope, or compass), an avionic electronic device, a security device, an industrial or consumer robot, and/or the like.

According to various embodiments of the present disclosure, an electronic device may be furniture, part of a building/structure, an electronic board, electronic signature receiving device, a projector, various measuring devices (e.g., water, electricity, gas or electro-magnetic wave measuring devices), and/or the like that include communication functionality.

According to various embodiments of the present disclosure, an electronic device may be any combination of the foregoing devices. In addition, it will be apparent to one having ordinary skill in the art that an electronic device according to various embodiments of the present disclosure is not limited to the foregoing devices.

According to various embodiments of the present disclosure, for example, a signal receiving apparatus may be an electronic device.

An embodiment of the present disclosure proposes a method and apparatus for sending/receiving a packet in a multimedia communication system supporting a forward error correction (FEC) scheme.

An embodiment of the present disclosure proposes a method and apparatus for sending/receiving a packet thereby increasing data recover efficiency in a multimedia communication system supporting an FEC scheme.

An embodiment of the present disclosure proposes a method and apparatus for sending/receiving a packet thereby acquiring efficient sending reliability in a multimedia communication system supporting an FEC scheme.

An embodiment of the present disclosure proposes a method and apparatus for sending/receiving a packet by considering a characteristic of the packet in a multimedia communication system supporting an FEC scheme.

An embodiment of the present disclosure proposes a method and apparatus for sending/receiving a packet by considering an FEC coding structure in a multimedia communication system supporting an FEC scheme.

An embodiment of the present disclosure proposes a method and apparatus for sending/receiving a packet by considering a packet sending timing point in a multimedia communication system supporting an FEC scheme.

An embodiment of the present disclosure proposes a method and apparatus for sending/receiving a packet by considering a split characteristic of the packet in a multimedia communication system supporting an FEC scheme.

An embodiment of the present disclosure proposes a method and apparatus for sending/receiving a packet by considering delay between a signal sending apparatus and a signal receiving apparatus in a multimedia communication system supporting an FEC scheme.

An embodiment of the present disclosure proposes a method and apparatus for sending/receiving a packet by considering a buffer size in a multimedia communication system supporting an FEC scheme.

An embodiment of the present disclosure proposes a method and apparatus for sending/receiving FEC configuration information related to an FEC scheme in a multimedia communication system supporting the FEC scheme.

A method and apparatus proposed in an embodiment of the present disclosure may be applied to various communication systems such as a digital video broadcasting system such as a mobile broadcasting service such as a digital multimedia broadcasting (DMB) service, a digital video broadcasting-handheld (DVP-H) service, an advanced television systems committee-mobile/handheld (ATSC-M/H) service, and the like, and an internet protocol television (IPTV) service, a moving picture experts group (MPEG) media transport (MMT) system, an evolved packet system (EPS), a long term evolution (LTE) mobile communication system, an LTE-advanced (LTE-A) mobile communication system, a high speed downlink packet access (HSDPA) mobile communication system, a high speed uplink packet access (HSUPA) mobile communication system, a high rate packet data (HRPD) mobile communication system proposed in a $3^{rd}$ generation project partnership 2 (3GPP2), a wideband code division multiple access (WCDMA) mobile communication system proposed in the 3GPP2, a code division multiple access (CDMA) mobile communication system proposed in the 3GPP2, an institute of electrical and electronics engineers (IEEE) mobile communication system, a mobile internet protocol (Mobile IP) system, and/or the like.

For convenience, it will be assumed that a multimedia communication system supporting an FEC scheme in which a method and apparatus proposed in an embodiment of the present disclosure is an MMT system.

In various embodiments of the present disclosure propose a packet sending/receiving apparatus and method for effectively repairing data packet loss in all electronic devices such as a portable telephone, a television (TV), a computer, an electronic bulletin board, a tablet and an electronic book which may provide various multimedia services such as a videoconferencing/video call as well as large-capacity contents such as high definition (HD) contents, ultra high definition (UHD) contents and the like.

Although a detailed FEC encoding scheme will not be described in various embodiments of the present disclosure, it will be understood by those of ordinary skill in the art that the FEC encoding scheme is not limited as a specific FEC encoding scheme such as a Reed-Solomon (RS) code, a low density parity check (LDPC) code, a turbo code, an XOR code, a pro-moving picture experts group (MPEG) FEC code, and the like.

The terms and definitions used for describing various embodiments of the present disclosure will be described below.

(1) FEC Code

The FEC code denotes an error correction code used for correcting an error symbol or an erasure symbol. The FEC code denotes an algorithm for encoding data such that the encoded data flow is resilient to data loss.

(2) Source Symbol

The source symbol denotes a unit of data used in an FEC encoding process.

(3) Repair Symbol

The repair symbol denotes an encoding symbol that contains redundancy information for error correction. The repair symbol denotes an encoding symbol which is not the source symbol. The repair symbol may be called a parity symbol.

(4) Source Packet

The source packet denotes a packet which is protected by an FEC encoding scheme.

(5) Source Packet Block

The source packet block denotes a segmented set of an FEC source flow that is to be protected as a single block.

(6) Source Symbol Block

The source symbol block denotes a set of source symbols generated from a single source packet block. That is, at least one source symbol is included in the source symbol block.

(7) Repair Symbol Block

The repair symbol block denotes a set of repair symbols which may be used to recover lost source symbols. That is, at least one repair symbol is included in the repair symbol block. The repair symbol block may be called parity symbol block.

(8) Encoding Symbol Block

The encoding symbol block denotes a set of encoding symbols. The encoding symbol block denotes a set of encoding symbols generated in an encoding process of a source symbol block. That is, at least one encoding symbols is included in the encoding symbol block.

(9) Encoding Symbol

The encoding symbol denotes a unit of data generated by an encoding process. Here, source symbols may be a part of encoding symbols.

(10) FEC Repair Packet

The FEC repair packet denotes an MMT protocol (MMTP) packet along with a repair FEC payload identifier (ID) to deliver one or more repair symbols of a repair symbol block.

(11) FEC Source Packet

The FEC source packet denotes an MMTP packet along with a source FEC payload ID.

(12) FEC Source or Repair Packet

The FEC source or repair packet denotes a generic term of an FEC repair packet or an FEC source packet. That is, the FEC source or repair packet may denote an FEC repair packet, an FEC source packet, or both of the FEC repair packet and the FEC source packet if necessary.

(13) FEC Source Packet Block

The FEC source packet block denotes a set of FEC source packets for delivering a source symbol block. That is, at least one FEC source packet is included in the source FEC packet block.

(14) FEC Repair Packet Block

The FEC repair packet block denotes a set of FEC repair packets for delivering a repair symbol block. That is, at least one FEC repair packet is included in the FEC repair packet block. The FEC repair packet block may be called FEC parity packet block.

(15) FEC Source or Repair Packet Block

The FEC source or repair packet block denotes a generic term of an FEC source packet block and an FEC repair packet block related to the FEC source packet block. That is, the FEC source or repair packet block may denote the FEC source packet block, the FEC repair packet block, or both of the FEC source packet block and the FEC repair packet block if necessary. That is, the FEC source or repair packet block denotes a set of FEC source of repair packets for delivering an encoding symbol block. So, at least one FEC source or repair packet is included in the FEC source or repair packet block.

(16) FEC Payload ID

The FEC payload ID denotes an ID that identifies contents of an MMTP packet with respect to an MMT FEC scheme. The MMT FEC scheme denotes an FEC scheme which an MMT system supports.

(17) Repair FEC Payload ID

The repair FEC payload ID denotes an FEC payload ID for repair packets. The repair FEC payload ID may be called a parity FEC payload ID. The repair FEC payload ID includes repair FEC configuration information for an FEC repair packet, and the repair FEC configuration information includes information related to an FEC source or repair packet that is sent first among at least one FEC source or repair packet if an FEC source or repair packet block includes the at least one FEC source or repair packet. Here, the information related to the FEC source or repair packet that is sent first includes information related to a time stamp of the FEC source or repair packet that is sent first. If a signal sending apparatus which sends a related repair FEC payload ID, e.g., an MMT sending entity supports a two-stage FEC coding structure, the information related to the FEC source or repair packet that is sent first includes a time stamp indicator (TS indicator) indicating information related to a time stamp in an FEC. The repair FEC payload ID and the time stamp will be described below, and a detailed description will be omitted herein.

(18) Source FEC Payload ID

The source FEC payload ID denotes an FEC payload ID for source packets. The source FEC payload ID includes source FEC configuration information for an FEC source packet, and the source FEC configuration information includes information related to an FEC source or repair packet that is sent first among at least one FEC source or repair packet if an FEC source or repair packet block includes the at least one FEC source or repair packet. Here, the information related to the FEC source or repair packet that is sent first includes information related to a time stamp of the FEC source or repair packet that is sent first. If a signal sending apparatus which sends a related repair FEC payload ID, e.g., an MMT sending entity supports a two-stage FEC coding structure, the information related to the FEC source or repair packet that is sent first includes a TS indicator indicating information related to a time stamp in an FEC. The source FEC payload ID, the time stamp, and the TS indicator will be described below, and a detailed description will be omitted herein.

(19) MMT

The MMT denotes a studied international standard for efficiently delivering MPEG data.

(20) FEC Source Flow

The FEC source flow denotes a flow of MMTP packets which are protected by an MMT FEC scheme.

(21) FEC Scheme

The FEC scheme denotes a specification which defines additional protocol aspects required for using FEC codes.

(22) FEC Repair Flow

The FEC repair flow denotes a data flow carrying repair symbols to protect an FEC source flow. The FEC repair flow may be called an FEC parity flow.

(23) FEC Encoded Flow

The FEC encoded flow denotes a logical set of flows which are composed of an FEC source flow and one or more association FEC repair flows.

(24) Asset

The asset denotes a multimedia data entity that is associated with a unique ID and that is used for building a multimedia presentation.

(25) Media Processing Unit (MPU)

The MPU denotes a generic container for independently decodable timed or non-timed data that is media codec agnostic.

(26) Package

The package denotes a logical collection of media data which is delivered using an MMT.

(27) MMT Packet

The MMT packet denotes a formatted unit of media data which is delivered using an MMTP.

(28) MMT Payload

The MMT payload denotes a formatted unit of media data which carries packets and/or signaling messages using an MMTP or internet application layer transport protocol. For example, the internet application layer transport protocol may be real-time transport protocol (RTP), and the like.

(29) MMTP

The MMTP denotes an application layer transport protocol for delivering an MMTP payload through an IP network.

An example of a structure of an MMT system supporting an FEC scheme according to an embodiment of the present disclosure will be described with FIG. 1.

FIG. 1 schematically illustrates an example of a structure of an MMT system supporting an FEC scheme according to an embodiment of the present disclosure.

Referring to FIG. 1, the MMT system includes an MMT sending entity 111, an MMT receiving entity 113, a package provider 115, and a plurality of asset providers, e.g., N asset providers, i.e., an asset provider #1 117-1, . . . , an asset provider #N 117-N. A communication is performed between the MMT sending entity 111 and the MMT receiving entity 113 based on an MMTP. The MMTP will be described below.

The MMTP is an application layer transport protocol that is designed to efficiently and reliably transport the MMT package. The MMTP supports several enhanced features, such as media multiplexing, network jitter calculation, and the like. These features enable to efficiently deliver contents composed of various types of encoded media data. The MMTP may run on top of existing network protocols, e.g., a user datagram protocol (UDP) or an IP, and supports various applications.

The MMT sending entity 111 may be an MMT entity which sends media data to one or more MMT receiving entities, and for example, be an MMT broadcasting server, and the like.

The MMT receiving entity 113 may be an MMT entity which receives and consumes the media data, and for example, be a wireless device such as a mobile station (MS), a user equipment (UE), and the like. For example, if the MMT sending entity 111 is the MMT broadcasting server, and the MMT receiving entity 113 is the MS, the MMT broadcasting server may send media data to the MS through a base station (BS). It will be noted that the BS is not shown in FIG. 1.

The MMT sending entity 111 sends packages to the MMT receiving entity 113 as MMTP packet flows. Here, a package denotes a logical collection of media data, and is delivered using an MMT technology. The MMT sending entity 111 sends an asset, presentation information (PI), and the like to the MMT receiving entity 113. The detailed description of the asset, and the PI will be omitted herein. The MMT sending entity 111 may be required to acquire contents from content providers (not shown in FIG. 1) based on PI of a package that are provided by the package provider 115.

The MMT sending entity 111 and the MMT receiving entity 113 send/receive MMT signaling through MMTP packet flows.

The package provider 115 and the content providers may be co-located. Media content is provided as an asset that is segmented into a series of encapsulated MMT processing units that forms an MMTP packet flow.

An MMTP packet flow of the media content is generated using associated transport characteristics information. Signaling messages may be used to manage delivery and consumption of the packages.

Referring to FIG. 1, the MMT sending entity 111 is a signal sending apparatus, and the MMT receiving entity 113 is a signal receiving apparatus.

An example of a structure of an MMT system supporting an FEC scheme according to an embodiment of the present disclosure has been described with reference to FIG. 1, and another example of a structure of an MMT system supporting an FEC scheme according to an embodiment of the present disclosure will be described with reference to FIG. 2.

Figure 2:
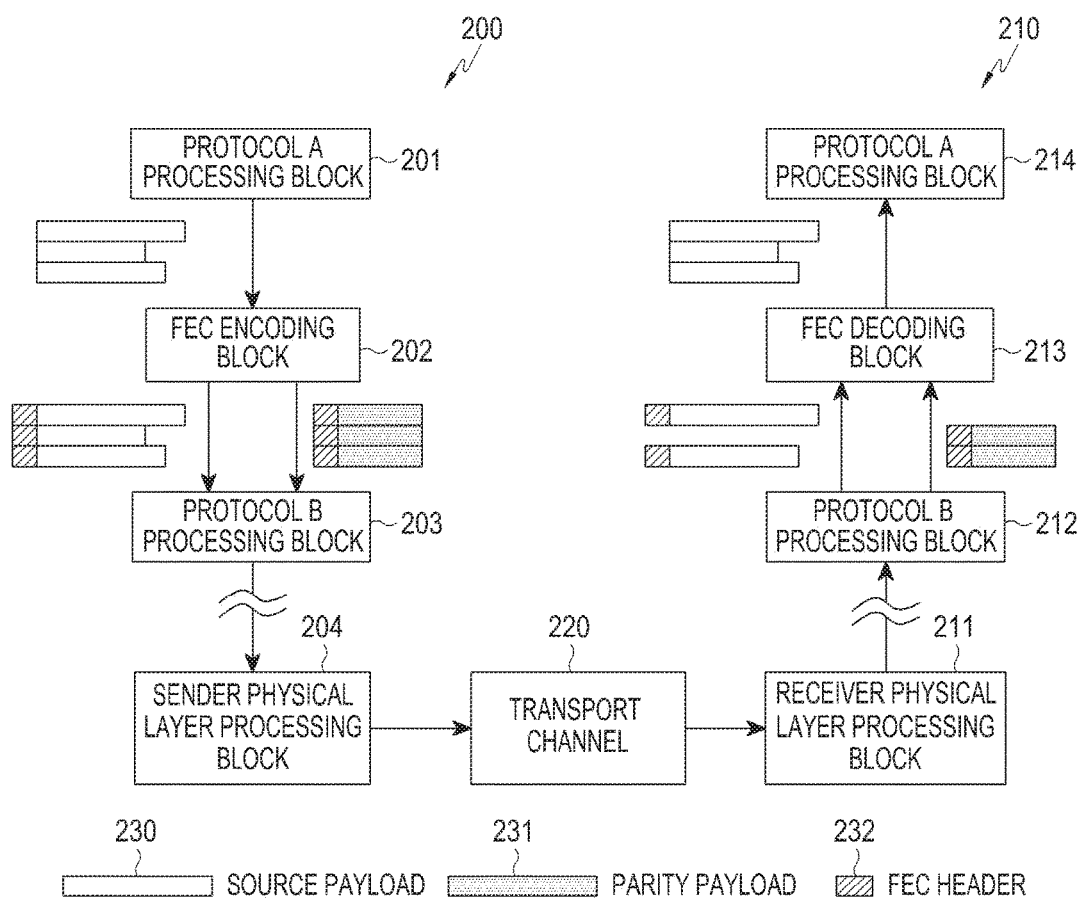
FIG. 2 schematically illustrates another example of a structure of an MMT system supporting an FEC scheme according to an embodiment of the present disclosure.

FIG. 2 schematically illustrates another example of a structure of an MMT system supporting an FEC scheme according to an embodiment of the present disclosure.

Referring to FIG. 2, the MMT system includes a signal sending apparatus 200 and a signal receiving apparatus 210.

The signal sending apparatus 200 includes a protocol A processing block 201 which performs a protocol A processing operation corresponding to a protocol A as an FEC upper protocol, an FEC encoding block 202, a protocol B processing block 203 which performs a protocol B processing operation corresponding to a protocol B as an FEC lower protocol, and a sender physical layer processing block 204.

The protocol A processing block 201 generates source payloads 230 by performing a protocol A processing operation on sending data, and outputs the source payloads 230 to the FEC encoding block 202.

The FEC encoding block 202 generates a source packet block including at least one source packet, and generates repair symbols including a parity payload 231 by performing an FEC encoding operation corresponding to a preset FEC scheme on the generated source packet block. The FEC encoding block 202 generates an FEC source packet by adding an FEC header 232 to the source packet and the repair symbol, and outputs the FEC source packet to the protocol B processing block 203. The FEC source packet is generated by combining the FEC header with the source packet, and an FEC repair packet is generated by combining the FEC header with the repair symbol.

Referring to FIG. 2, an FEC source packet is a data unit which is generated in a form that there is a source payload after an FEC header. Alternatively, the FEC source packet may be a data unit which is generated in a form that there is the FEC header after the source payload.

Referring to FIG. 2, the FEC encoding block 202 is located between the protocol A processing block 201 and the protocol B processing block 203. Alternatively, the protocol A processing block 201 may include the FEC encoding block 202. In this case, a protocol header for performing a function of the protocol A processing block 201 may be included in an FEC parity packet, and the protocol A processing block 201 including the FEC encoding block 202 may include a multiplexer for generating a source packet and a parity packet as one packet flow.

The protocol B processing block 203 generates a protocol B signal by performing a protocol B processing operation corresponding to the protocol B on the FEC source packet or the FEC parity packet transferred from the FEC encoding block 202, and transfers the protocol B signal to the sender physical layer processing block 204.

The sender physical layer processing block 204 converts the protocol B signal transferred from the protocol B processing block 203 into a physical layer signal which is appropriate for physical layer sending, and transfers the physical layer signal to the signal receiving apparatus 210 through the transport channel 220. There may be various layers between the protocol B processing block 203 and the sender physical layer processing block 204, and a detailed description of the various processing blocks will be omitted.

While the protocol A processing block 201, the FEC encoding block 202, the protocol B processing block 203, and the sender physical layer processing block 204 are shown in FIG. 2 as separate units, it is to be understood that this is for merely convenience of description. In other words, two or more of the protocol A processing block 201, the FEC encoding block 202, the protocol B processing block 203, and the sender physical layer processing block 204 may be incorporated into a single unit.

The signal receiving apparatus 210 includes a receiver physical layer processing block 211, a protocol B processing block 212 which performs a protocol B processing operation corresponding to the protocol B, an FEC decoding block 213, and a protocol A processing block 214 which performs a protocol A processing operation corresponding to the protocol A.

The receiver physical layer processing block 211 converts a physical layer signal received in the signal receiving apparatus 210 from the signal sending apparatus 200 through the transport channel 220 into a protocol B signal, and transfers the protocol B signal to the protocol B processing block 212. As described in the signal sending apparatus 200, there may be various layers between the protocol B processing block 212 and the receiver physical layer processing block 211, and a detailed description of the various processing blocks will be omitted.

The protocol B processing block 212 generates a protocol B signal by performing a protocol B processing operation on a physical layer signal received in the protocol B processing block 212, and delivers the protocol B signal to the FEC decoding block 213. The protocol B signal may be an FEC packet, i.e., an FEC source packet or an FEC parity packet. Some of FEC packets sent from the signal sending apparatus 200 are lost due to an effect of network congestion and an error occurred on a physical layer. So, some of the FEC packets sent from the signal sending apparatus 100 may not be delivered to the FEC decoding block 213.

The FEC decoding block 213 detects source payloads sent from the signal sending apparatus 200 by performing an FEC decoding operation on an FEC packet transferred from the protocol B processing block 212, and delivers the detected source payloads to the protocol A processing block 214. The protocol A processing block 214 detects sending data by performing a protocol A processing operation on source payloads delivered from the FEC decoding block 213.

As described above, an FEC header includes an FEC payload ID, an FEC header for an FEC source packet included a source FEC payload ID, and an FEC header for an FEC parity packet included a repair FEC payload ID.

Since an embodiment of the present disclosure is applied to an MMT system, the source packet becomes an MMT packet, an FEC source packet becomes an MMT packet with a source FEC payload ID, and an FEC repair packet becomes an MMT packet with a repair FEC payload ID which carries a repair symbol.

While the receiver physical layer processing block 211, the protocol B processing block 212, the FEC decoding block 213, and the protocol A processing block 214 are shown in FIG. 2 as separate units, it is to be understood that this is for merely convenience of description. In other words, two or more of the receiver physical layer processing block 211, the protocol B processing block 212, the FEC decoding block 213, and the protocol A processing block 214 may be incorporated into a single unit.

Another example of a structure of an MMT system supporting an FEC scheme according to an embodiment of the present disclosure has been described with reference to FIG. 2, and an architecture for application layer forward error correction (AL-FEC) in an MMT system supporting an FEC scheme according to an embodiment of the present disclosure will be described with reference to FIG. 3. For convenience, the architecture for the AL-FEC will be called AL-FEC architecture.

Figure 3:
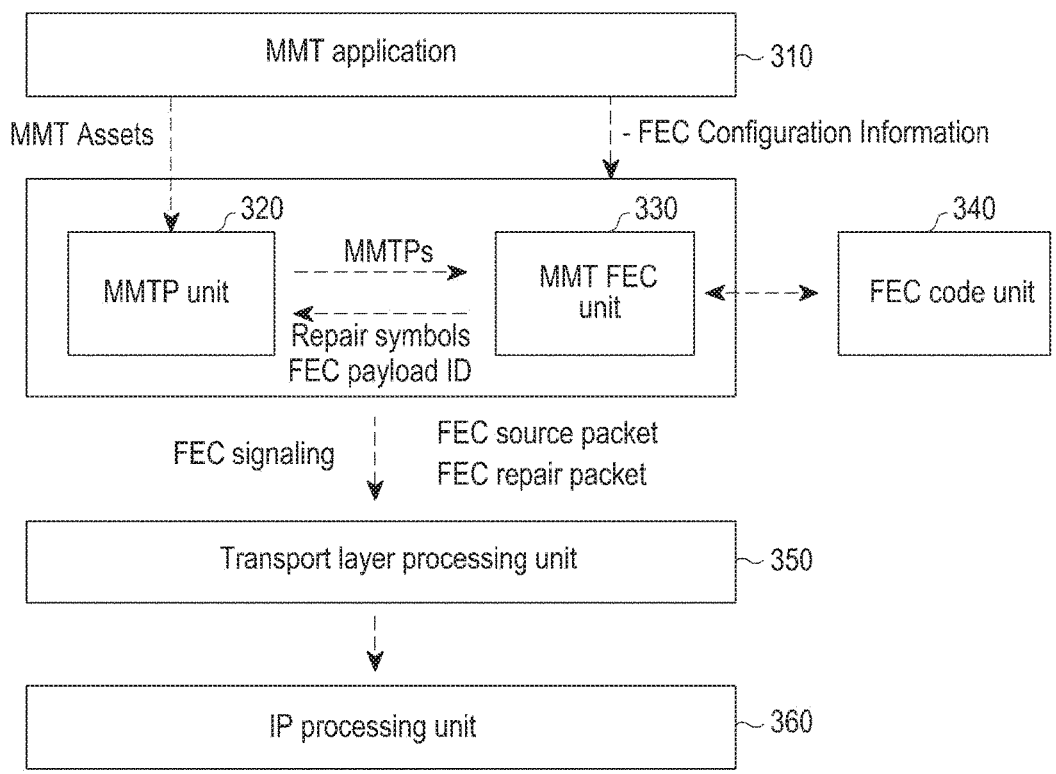
FIG. 3 schematically illustrates application layer FEC (AL-FEC) architecture in an MMT system supporting an FEC scheme according to an embodiment of the present disclosure.

FIG. 3 schematically illustrates AL-FEC architecture in an MMT system supporting an FEC scheme according to an embodiment of the present disclosure.

Referring to FIG. 3, it will be noted that the AL-FEC architecture in FIG. 3 is a structure of an AL-FEC architecture which is included in a signal sending apparatus.

The AL-FEC architecture includes an MMT application unit 310, an MMTP unit 320, an MMT FEC unit 330, an FEC code unit 340, a transport layer processing unit 350, and an internet protocol (IP) processing unit 360. Here, the MMTP unit 320 and the MMT FEC unit 330 are included in an AL-FEC processor.

The MMT scheme provides an AL-FEC mechanism for reliable delivery in an IP network. An FEC scheme which the MMT system supports (MMT FEC scheme) is described as a building block of a delivery function.

Firstly, MMT assets are delivered from the MMT application unit 310 to the MMTP unit 320, the MMTP unit 320 generates MMTP packets by applying a preset MMTP packetization scheme to the transferred MMT assets, and delivers the generated MMTP packets to the MMT FEC unit 330 for protection on sending/receiving. The MMTP packetization scheme used in the MMTP unit 320 may be implemented with various schemes, and a detailed description will be omitted herein.

The MMT application unit 310 provides FEC configuration information to the MMT FEC unit 330, and the FEC configuration information includes an ID of an FEC encoded flow, information related to an FEC coding structure and an FEC code, and the like. The FEC configuration information is delivered to a signal sending entity corresponding to the signal sending entity, the FEC configuration information will be described below, and a detailed description will be omitted herein.

The MMT FEC unit 330 generates repair symbols, repair FEC payload IDs and source FEC payload IDs by encoding the MMTP packets delivered from the MMTP unit corresponding to a preset FEC scheme, and delivers the repair symbols, the repair FEC payload IDs and the source FEC payload IDs to the MMTP unit 320. The MMTP unit 320 delivers the repair symbols delivered from the MMT FEC unit 330 along with the MMTP packets to the transport layer processing unit 350.

Meanwhile, the MMT sending entity determines MMT assets within packages which require protection and the number of FEC source flows. One or more of the MMT assets are protected as a single FEC source flow, and the single FEC source flow consists of MMTP packets carrying the one or more of the MMT assets. The FEC source flow and FEC configuration information on the FEC source flow are delivered to the MMT FEC unit 330 for protection. The MMT FEC unit 330 uses an FEC code(s) to generate repair symbols including one or more FEC repair flows. The repair symbols are delivered to the MMTP unit 320 along with the source FEC payload IDs and the repair FEC payload IDs. Then MMTP unit 320 delivers FEC source and repair packets to the MMT receiving entity. Then, an MMTP unit included in the MMT receiving entity delivers the FEC source flow and an associated FEC repair flow(s) of the FEC source flow to an MMT FEC unit included in the MMT receiving entity. The MMT FEC unit recovers MMTP packets by decoding the FEC source flow and the associated FEC repair flow(s) of the FEC source flow delivered from the MMTP unit based on a preset FEC scheme, and delivers the recovered MMTP packets to the MMTP unit.

Meanwhile, the MMT FEC unit 330 divides the FEC source flow into source packet blocks and generates source symbol blocks. The MMT FEC unit 330 delivers the source symbol blocks to the FEC code unit 340 for FEC encoding. Here, the FEC encoding means a process to generate repairs symbols from the source symbol block.

The FEC code unit 340 generates repair symbols by FEC encoding the source symbol blocks delivered from the MMT FEC unit 330 based on a preset FEC code algorithm. The FEC code algorithm used in the FEC code unit 340 may be implemented with various formats. In an embodiment of the present disclosure, it will be assumed that the FEC code algorithm is an FEC code algorithm in which repairs symbols are generated from a source symbol block as used in an international organization for standardization/international electro technical commission (ISO/IEC) 23008-10.

Meanwhile, the AL-FEC architecture will be described by considering the FEC configuration information aspect.

The MMT application unit 310 determines MMT assets to be delivered after AL-FEC protection, and delivers the determined MMT assets to the MMTP unit 320. The MMT application unit 310 delivers AL-FEC related information, e.g., FEC configuration information to the MMTP unit 320 and the MMT FEC unit 330, i.e., an AL-FEC processor. The FEC configuration information may include FEC control information included in an FEC message, information related to an FEC source or repair packet block sending time period, and the like, a detailed description of the FEC configuration information will be below, and a detailed description will be omitted herein.

The MMTP unit 320 generates MMT packets by packetizing input MMT assets, generates a source packet by adding an MMT packet header to the generated MMT packets, and outputs a source packet block including at least one source packet to the MMT FEC unit 330. The MMT packet header information related to time at which an MMT packet is sent, e.g., a time stamp. The MMTP unit 320 sets a time stamp for each MMT packet by performing scheduling operation in order that a difference between sending time information on an FEC source or repair packet that is sent first among at least one FEC source or repair packet included in an FEC source or repair packet block and sending time information on an FEC source or repair packet which is lastly sent among the at least one FEC source or repair packet included in the FEC source or repair packet block, i.e., a time stamp difference is within the FEC source or repair packet block sending time period included in the FEC configuration information.

The MMT FEC unit 330 generates a source symbol block from each packet block which is input according to a given source symbol block generation scheme based on the FEC configuration information input from the MMT application unit 310. Here, if information on source symbol block generation scheme according to an embodiment of the present disclosure is given as the FEC configuration information, and the information on source symbol block generation scheme is included in the FEC configuration information, the MMT FEC unit 330 generates a source symbol block according to the source symbol block generation scheme included in the FEC configuration information. After generating the source symbol block, the MMT FEC unit 330 delivers the generated source symbol block to the FEC code unit 340.

The FEC code unit 340 generates a repair symbol block from the source symbol block delivered from the MMT FEC unit 330 to deliver the repair symbol block to the MMT FEC unit 330.

The MMT FEC unit 330 generates an FEC payload ID for the source symbol block and the repair symbol block and delivers repair symbols received from the FEC code unit 340 to the MMTP unit 320.

The MMTP unit 320 generates an FEC source packet by adding a source FEC payload ID to a source packet, and generates an FEC repair packet by adding a repair FEC payload ID, an MMTP payload header and an MMT packet header to a repair symbol using an input repair symbol and an FEC payload ID. The MMTP unit 320 delivers the generated FEC source packet and FEC repair packet to the IP unit 360 through the transport layer unit 350. For example, a transport layer may be a user datagram protocol (UDP), and the like. An FEC payload ID for an FEC source packet included in an FEC source or repair packet or FEC payload ID for an FEC repair packet included in the FEC source or repair packet includes sending time information for an FEC source or repair packet that is sent first among at least one FEC source or repair packet included in the FEC source or repair packet block, e.g., 'T0'. Alternatively, the sending time information T0 may be sent by performing an FEC encoding operation on an MMT packet header including the T0 and including the T0 to an MMT packet header for an FEC repair packet after the FEC encoding operation.

The MMTP unit 320 adds an MMT payload header and an MMT packet header to an FEC message including the FEC configuration information generated by the MMT application unit 310 to send the FEC message that the MMT payload header and the MMT packet header are added.

Not shown in FIG. 3, the MMT application unit 310 may generate a hypothetical receiver buffering model (HRBM) message proposed in an embodiment of the present disclosure. Here, the HRBM message includes information related to a maximum buffer size, e.g., 'maximum buffer size', information related to delay between a signal sending apparatus and a signal receiving apparatus, e.g., 'fixed end-to-end delay', and the like. The MMT application unit 310 adds an MMT payload header and an MMT packet header to the generated HRBM message to deliver the HRBM message that the MMT payload header and the MMT packet header are added.

Meanwhile, the fixed end-to-end delay denotes maximum delay time until a packet is received in a signal receiving apparatus by considering a network situation on packet sending, and may or may not include a sending time period of an FEC source or repair packet block. If the fixed end-to-end delay includes the sending time period of the FEC source or repair packet block, the signal receiving apparatus may perform an FEC decoding operation corresponding to the fixed end-to-end delay, i.e., sending time of a packet Ts+fixed end-to-end delay, and provide the packet to an MMT application unit (not shown in FIG. 3) included in the signal receiving apparatus. If the fixed end-to-end delay does not include the sending time period of the FEC source or repair packet block, the signal receiving apparatus may perform the FEC decoding operation corresponding to time which is indicated by FEC source or repair packet sending time period information of the FEC message and the fixed end-to-end delay, i.e., sending time of a packet Ts+fixed end-to-end delay+an FEC source or repair packet sending time period, and provide the packet to the MMT application unit included in the signal receiving apparatus. The FEC source or repair packet sending time period denotes that all FEC source or repair packet blocks should be sent during the FEC source or repair packet sending time period.

Referring to FIG. 3, an FEC source packet is generated on a source packet block basis and an FEC repair packet is generated and sent on the source packet block basis. However, in an actual network environment, it will be understood by those of ordinary skill in the art that a source packet which is generated by the MMTP unit 320 is input to the MMT FEC unit 330, the source packet is generated as an FEC source packet by adding a source FEC payload ID to the source packet at the same time, the FEC source packet is immediately sent. In this case, the MMT FEC unit 330 stores the source packet in an inner memory included in the MMT FEC unit 330, generates a source symbol block from the source packet block if the last source packet for the source packet block is input to the MMT FEC unit 330, and delivers the source symbol block to the FEC code unit 340. Then, it is preferred that the FEC code unit 340 generates a parity symbol block based on the source symbol block delivered from the MMT FEC unit 330 and delivers the generated parity symbol block to the MMTP unit 320 along with an FEC payload ID, and the MMTP unit 320 generates FEC repair packets based on the parity symbol block delivered from the MMT FEC unit 340 to deliver the FEC repair packets.

Although the MMT application unit 310, the MMTP unit 320, the MMT FEC unit 330, the FEC code unit 340, the transport layer processing unit 350, and the IP processing unit 360 are described as separate units, it is to be understood that this is merely for convenience of description. In other words, two or more of the MMT application unit 310, the MMTP unit 320, the MMT FEC unit 330, the FEC code unit 340, the transport layer processing unit 350, and the IP processing unit 360 may be incorporated into a single unit.

An AL-FEC architecture in an MMT system supporting an FEC scheme according to an embodiment of the present disclosure has been described with reference to FIG. 3, and a two-stage FEC coding structure used in an MMT system supporting an FEC scheme will be been described with reference to FIG. 4.

Figure 4:
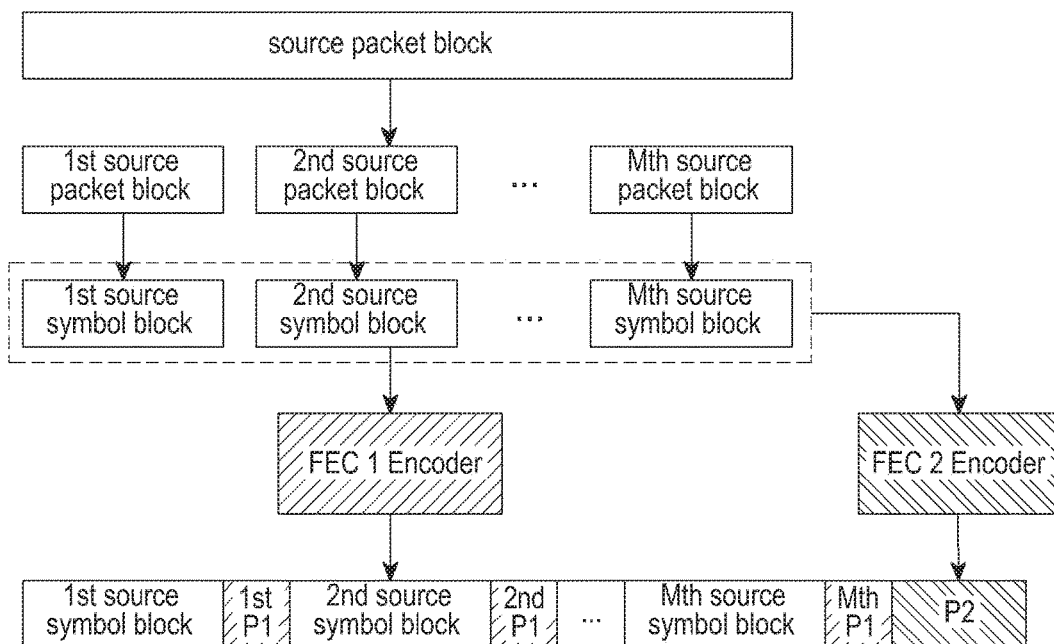
FIG. 4 schematically illustrates a two-stage FEC coding structure used in an MMT system supporting an FEC scheme according to an embodiment of the present disclosure.

FIG. 4 schematically illustrates a two-stage FEC coding structure used in an MMT system supporting an FEC scheme according to an embodiment of the present disclosure.

Referring to FIG. 4, an MMT FEC scheme provides a multi-level construction of MMTP packets for layered or non-layered media data for an appropriate level of protection for MMT asset in an FEC source flow. For example, the multi-level construction includes a two-stage FEC coding structure, a layer-aware FEC (LA-FEC) coding structure, and the like.

In an MMT scheme, the two-stage FEC coding structure which is for protecting MMTP packets which require relatively high reliability using more than one FEC code has been proposed. The two-stage FEC coding structure denotes an FEC coding structure for an AL-FEC for protecting a source packet included a predetermined number of MMTP packets.

Referring to FIG. 4, the ith P1 denotes a repair symbol for the ith source symbol block, P2 denotes a repair symbol block for a source symbol block. Here, i=1, 2, . . . , M.

A source packet block will be encoded according to one of a plurality of FEC coding structures, i.e., an FEC coding structure corresponding to a case 0, an FEC coding structure corresponding to a case 1, and an FEC coding structure corresponding to a case 2. The FEC coding structure corresponding to the case 0, the FEC coding structure corresponding to the case 1, and the FEC coding structure corresponding to the case 2 will be described below.

(1) FEC Coding Structure Corresponding to a Case 0(Case 0)

An FEC coding structure corresponding to the Case 0 denotes that FEC encoding is not applied.

(2) FEC Coding Structure Corresponding to a Case 1(Case 1)

An FEC coding structure corresponding to the Case 1 denotes a one-stage FEC coding structure.

(3) FEC Coding Structure Corresponding to a Case 2(Case 2)

An FEC coding structure corresponding to the Case 2 denotes a two-stage FEC coding structure.

For two-stage FEC coding structure, one source packet block is split into M source packet blocks. Each of the M source packet blocks may be called a source packet sub-block. Here, M is greater than 1 (M>1). The split ith source packet block, i.e., the ith source packet sub-block is converted to the ith source symbol block corresponding to one of source symbol block generation (SSBG) modes. The SSBG modes will be described below, and a detailed description will be omitted herein.

Then, the ith source symbol block is encoded by an FEC 1 code. Here, i=1, 2, . . . , M. Then, M source symbol blocks are concatenated to form a single source symbol block by an FEC 2 code.

Meanwhile, M repair symbol blocks are generated from M source symbol blocks by the FEC 1 code, respectively, and one repair symbol block is generated from the concatenated source symbol block by the FEC 2 code.

For the FEC coding structure corresponding to the Case 0, both FEC 1 and FEC 2 encoding will be skipped. For the FEC coding structure corresponding to the Case 0, no repair symbols are generated.

For the FEC coding structure corresponding to the Case 1, M will be set to '1' and either FEC 1 encoding or FEC 2 encoding will be skipped.

The detailed description of the two-stage FEC coding structure will be followed.

According to a two-state FEC coding structure, an MMT FEC unit splits source packet sub-blocks including a predetermined number of source packets into M (M is an integer greater than 1) first source packet sub-blocks (1~Mth source packet blocks), generates first source symbol sub-blocks (1~Mth source symbol blocks) from each of the first source packet sub-blocks, and generates the first encoding symbol including first repair symbol blocks by performing the first FEC encoding operation on each of the first source symbol sub-blocks. Here, the first FEC encoding operation denotes an encoding operation based on the FEC code 1.

The MMT FEC unit generates the second encoding symbol block including the second repair symbol block which is generated by the second FEC encoding operation by generating M first source symbol sub-blocks as the second source symbol block. Here, the second FEC encoding operation denotes an encoding operation based on the FEC code 2. The first FEC encoding operation and the second FEC encoding operation may use the same FEC code or different FEC codes. Here, an FEC code which may be used in an embodiment of the present disclosure may be one of currently known codes such as a Reed Solomon (RS) code, a low density parity check (LDPC) code, a Raptor code, an exclusive OR (XOR) code, and the like, and codes which will be developed, and is not limited to a specific code.

Referring to FIG. 4, the ith P1 is a repair symbol block for the ith source symbol block, and P2 is a repair symbol block for a source symbol block, where i=1, 2, . . . , M.

A two-stage FEC coding structure used in an MMT system supporting an FEC scheme according to an embodiment of the present disclosure has been described with reference to FIG. 4, and an LA-FEC coding structure used in an MMT system supporting an FEC scheme according to an embodiment of the present disclosure will be described with reference to FIG. 5.

Figure 5:
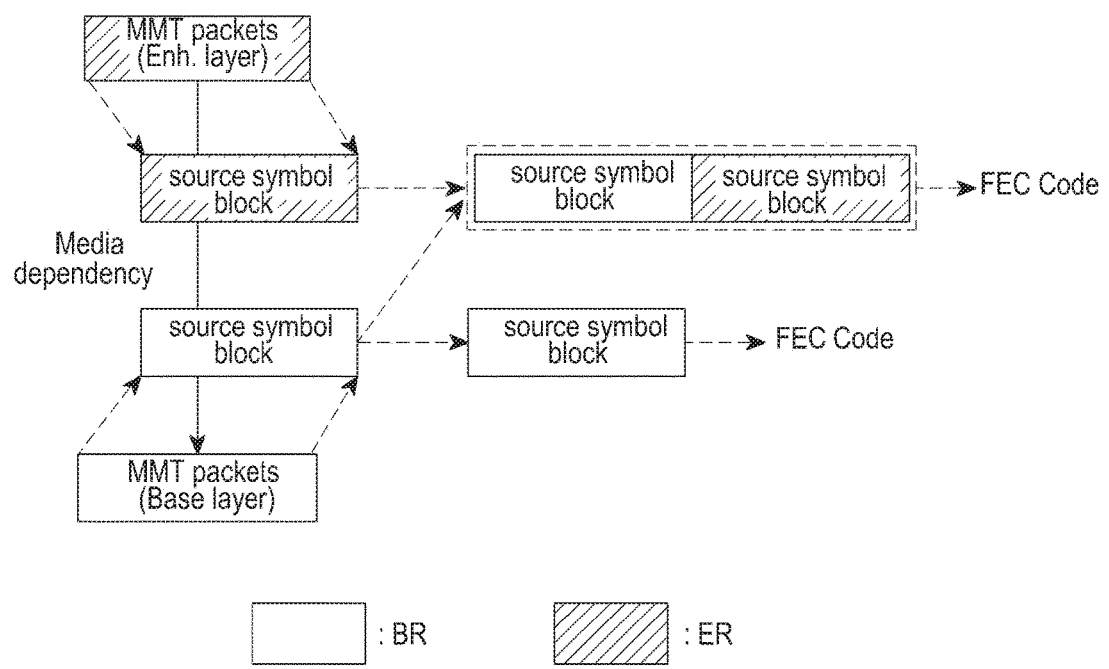
FIG. 5 schematically illustrates an layer-aware FEC (LA-FEC) coding structure used in an MMT system supporting an FEC scheme according to an embodiment of the present disclosure.

FIG. 5 schematically illustrates an LA-FEC coding structure used in an MMT system supporting an FEC scheme according to an embodiment of the present disclosure.

Referring to FIG. 5, an LA-FEC coding structure may be used for efficiently protecting media data with a layer structure, i.e., layered media data. For example, the layered media data may be contents which are encoded using a scalable video coding (SVC) scheme or multi-view video coding (MVC) scheme, and the like. That is, the LA-FEC coding structure may be applied with any FEC code and is specific for the layered media data.

The LA-FEC coding structure exploits a dependency across layers of a media for FEC construction and consists in generation of several repair flows associated to each layer. In each layer, each repair flow protects data of related layer of each repair flow and data of all layers, each layer depends on, if any. For convenience, each layer may be called a complementary layer.

Firstly, MMTP packets from different layers are grouped into source symbol blocks independently. If the LA-FEC coding structure is used, a source symbol block generated for FEC encoding of a repair flow will combine a source symbol block of a related layer and source symbol blocks from all complementary layers of the relate layer, if any. The combination of the source symbol blocks from the different layers will be performed following a dependency hierarchy from the media, i.e., with each source symbol block following the source symbol block of a complementary layer of the related layer.

Referring to FIG. 5, there is an example of source symbol block generation for a layered media data with two layers for an LA-FEC coding structure. A base layer and an enhancement layer are expressed in the LA-FEC coding structure in FIG. 5, and the enhancement layer depends on a base layer of a layered media stream.

That is, a source block configuration for applying an LA-FEC encoding scheme in a case that a media includes two layers is shown in the LA-FEC coding structure in FIG. 5. In FIG. 5, a base representation (BR) of a base layer denotes data which is independently decodable in a media codec, and an enhancement representation (ER) of an enhanced layer denotes data which is dependent on the BE. In FIG. 5, it will be noted that a BR is used together if parity for an ER1 is generated.

An LA-FEC coding structure used in an MMT system supporting an FEC scheme according to an embodiment of the present disclosure has been described with reference to FIG. 5, and a process of generating source packet blocks and source symbol blocks using an MMT packet stream in an MMT system supporting an FEC scheme according to an embodiment of the present disclosure will be described with reference to FIG. 6.

Figure 6:
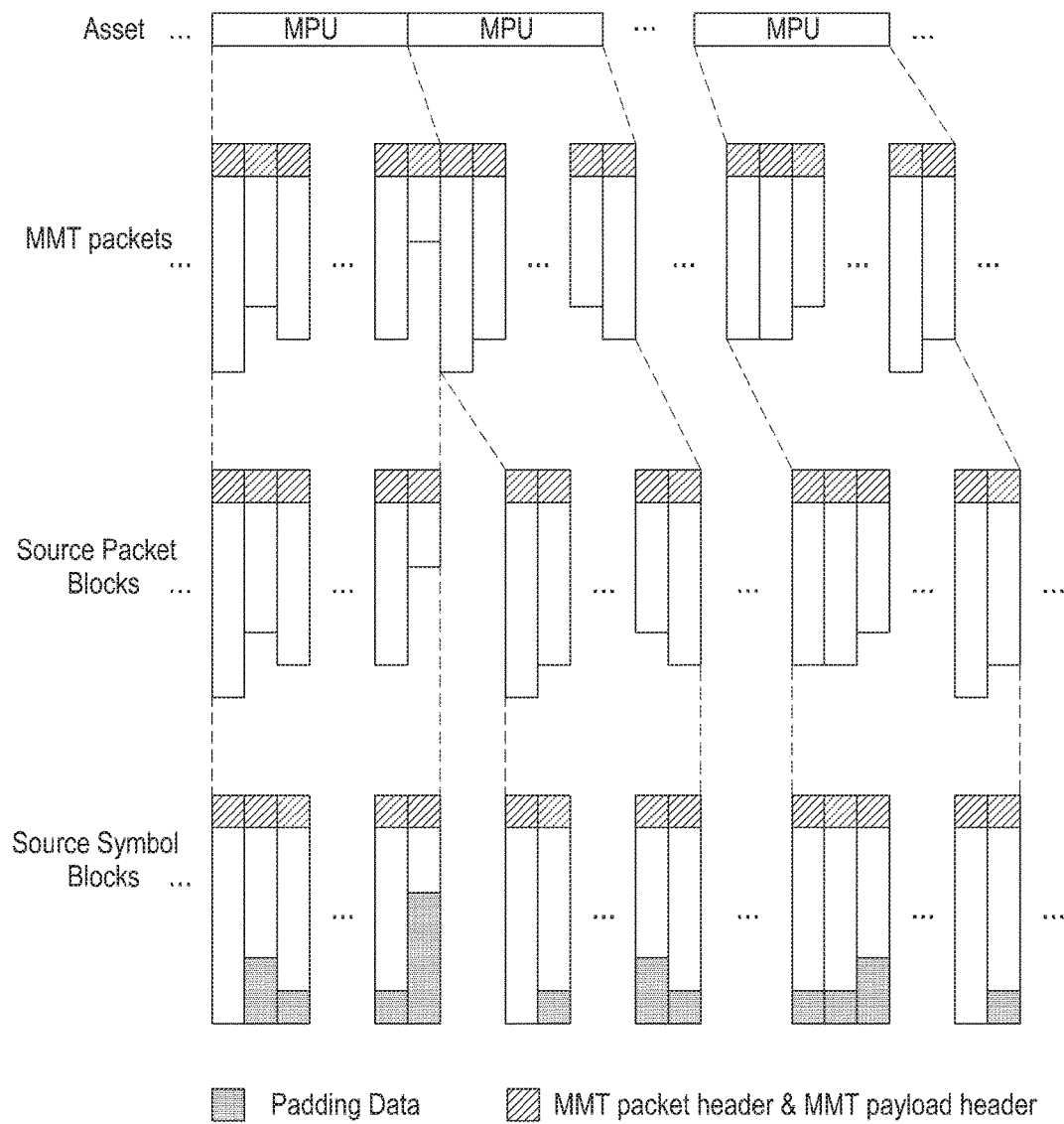
FIG. 6 schematically illustrates a process of generating source packet blocks and source symbol blocks using an MMT packet stream in an MMT system supporting an FEC scheme according to an embodiment of the present disclosure.

FIG. 6 schematically illustrates a process of generating source packet blocks and source symbol blocks using an MMT packet stream in an MMT system supporting an FEC scheme according to an embodiment of the present disclosure.

Referring to FIG. 6, an asset includes a plurality of MPUs, and each MPU is generated as MMT packets after packetization.

If each MPU is packetized into MMT packets, a header included in each MMT packet includes sending time information for a related MMT packet, I.E., A time stamp. The MMT packets are split into source packet blocks including a preset number of MMT packets respectively, and each of the source packet blocks are converted to a source symbol block including source symbols which have the same length (T). In a case that a source packet block is converted to a source symbol block, if a length of a source packet is less than T, a source symbol block of a length T is generated by inserting padding data to the source packet. In this way, the last source packet among source packets included in the source packet block may be also generated as a source symbol block.

A process of generating source packet blocks and source symbol blocks using an MMT packet stream in an MMT system supporting an FEC scheme according to an embodiment of the present disclosure has been described with reference to FIG. 6, and a process of generating a repair symbol block using a source symbol block in an MMT system supporting an FEC scheme according to an embodiment of the present disclosure will be described with reference to FIG. 7.

Figure 7:
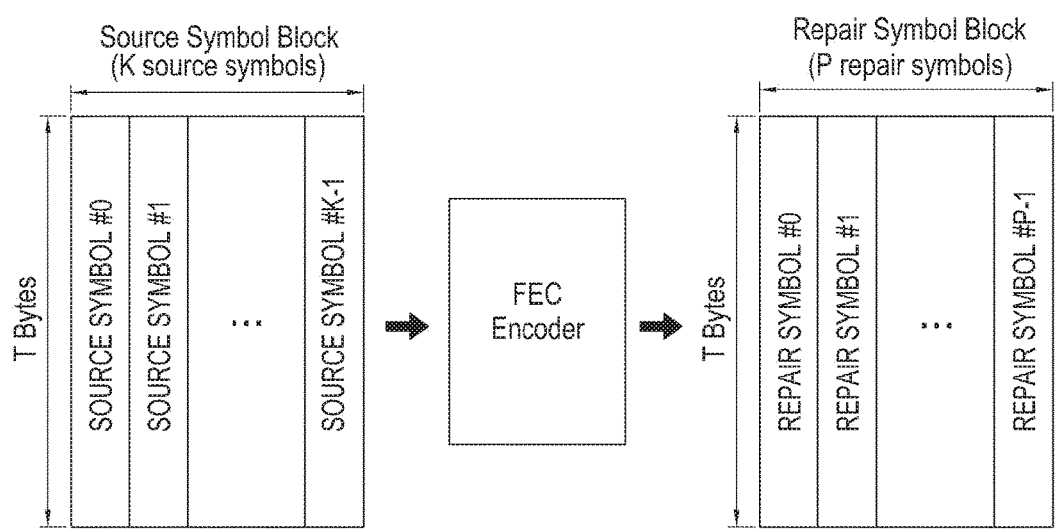
FIG. 7 schematically illustrates a process of generating a repair symbol block using a source symbol block in an MMT system supporting an FEC scheme according to an embodiment of the present disclosure.

FIG. 7 schematically illustrates a process of generating a repair symbol block using a source symbol block in an MMT system supporting an FEC scheme according to an embodiment of the present disclosure.

Referring to FIG. 7, an encoding symbol block includes a source symbol block, and a repair symbol block which is generated from the source symbol block. The source symbol block is generated from a source packet block according to a preset SSBG mode. The repair symbol block is generated from a related source symbol block by an FEC encoding scheme. Here, an encoding symbol format is shown in FIG. 7.

That is, a process of generating a repair symbol block from a source symbol block using an FEC code is shown in FIG. 7. In FIG. 7, K source symbols, i.e., a source symbol block including a source symbol #0, a source symbol #1, . . . , a source symbol #K−1 is input to an FEC encoder, and the FEC encoder generates a repair symbol block including P repair symbol, i.e., a repair symbol #0, a repair symbol #1, . . . , a repair symbol #P−1 to output the generated repair symbol block. Here, each of the source symbol #0, the source symbol #1, . . . , the source symbol #K−1, the repair symbol #0, the repair symbol #1, . . . , a repair symbol #P−1 has a length of T bytes.

A process of generating a repair symbol block using a source symbol block in an MMT system supporting an FEC scheme according to an embodiment of the present disclosure has been described with reference to FIG. 7, and a process of setting a time stamp for an FEC source or repair packet that is sent first among FEC source or repair packets included in an FEC source or repair packet block in an MMT system supporting an FEC scheme according to an embodiment of the present disclosure will be described with reference to FIG. 8.

Figure 8:
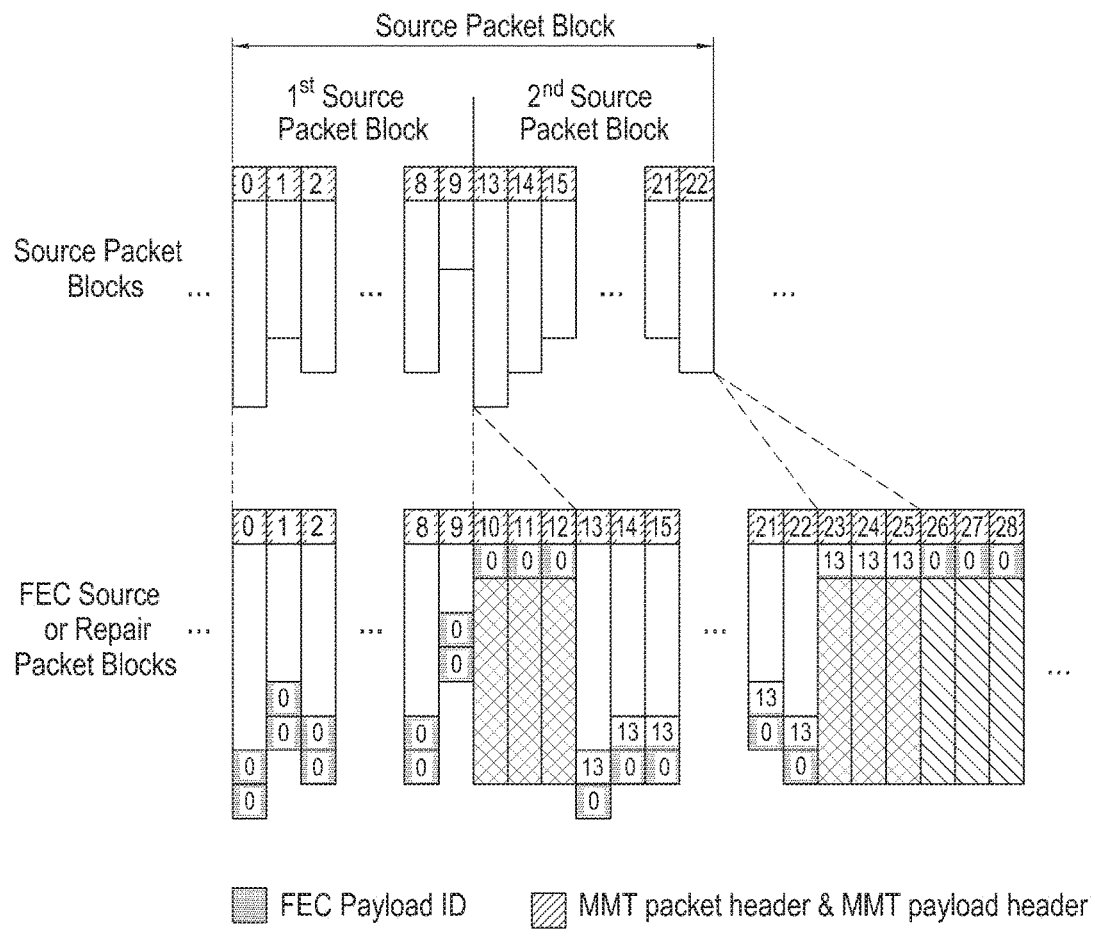
FIG. 8 schematically illustrates a process of setting a time stamp for an FEC source or repair packet that is sent first among FEC source or repair packets included in an FEC source or repair packet block in an MMT system supporting an FEC scheme according to an embodiment of the present disclosure.

FIG. 8 schematically illustrates a process of setting a time stamp for an FEC source or repair packet that is sent first among FEC source or repair packets included in an FEC source or repair packet block in an MMT system supporting an FEC scheme according to an embodiment of the present disclosure.

Referring to FIG. 8, an AL-FEC processor (not shown in FIG. 8) splits a source packet block including 20 source packets which are generated as in FIG. 6 into two source packet sub-blocks, each source packet sub-block including 10 source packets for applying a two-stage FEC coding structure as described in FIG. 4. The AL-FEC processor generates three repair symbols by an FEC 1 code for each of the two source packet sub-blocks, and generates three repair symbols by an FEC 2 code for the source packet block including the 20 source packets by applying the two-stage FEC coding structure to the generated two source packet sub-blocks. The AL-FEC processor generates an FEC source or repair packet block by adding an FEC payload ID to the source packet sub-blocks and the repair symbols.

A header included in each of the source packets includes a time stamp for a related packet on a source packet generation, and a header included in a repair packet includes a time stamp for a related packet.

Here, the FEC payload ID includes a time stamp for an FEC source or repair packet that is sent first among FEC source or repair packets included in an FEC source or repair packet block in which each packet is included. In this case, if the two-stage FEC coding structure is applied, a source FEC payload ID for a source packet sub-block includes a time stamp for an FEC source or repair packet that is sent first among FEC source or repair packets included in an FEC source or repair packet block for the source packet sub-block and a time stamp for an FEC source or repair packet that is sent first among FEC source or repair packets included in an FEC source or repair packet block for the source packet block in which the source packet sub-block is included, and a repair FEC payload ID includes a time stamp for an FEC source or repair packet that is sent first among FEC source or repair packets included in a related FEC source or repair packet block.

Although not shown in FIG. 8, if one-stage FEC coding structure is applied, a source FEC payload ID includes only a time stamp for an FEC source or repair packet that is sent first among FEC source or repair packets included in a related FEC source or repair packet block, and if an LA-FEC coding structure is applied as described in FIG. 5, the source FEC payload ID includes only a time stamp for an FEC source or repair packet that is sent first among FEC source or repair packets included in an FEC source or repair packet block including a base layer and enhancement layers.

Referring to FIG. 8, an AL-FEC processor generates an MMT packet by including a time stamp to each of headers included in first 10 MMT packets among 20 MMT packets in a form of 0, 1, 2, . . . 8, 9, and by including a time stamp to each of headers included in other 10 MMT packets in a form of 13, 14, 15, . . . , 21, 22 by considering that three FEC repair packets will be generated.

Then, total six FEC repair packets are generated by an FEC 1 code, a time stamp is included in each of MMT headers included in first three FEC repair packets in a form of 10, 11, 12, and a time stamp is included in each of MMT headers included in next three FEC repair packets in a form of 23, 24, 25.

A time stamp is included in each of MMT headers included in 3 FEC repair packets which are generated by an FEC 2 code in a form of 26, 27, 28, an FEC payload ID is added to each packet after the 3 FEC repair packets are packetized. That is, a source FEC payload ID is added to an FEC source packet, and a repair FEC payload ID is added to a FEC repair packet. A time stamp of an FEC source or repair packet that is sent first among FEC source or repair packets included in the FEC source or repair packet block as "0" is set for each FEC source or repair packet included in an FEC source or repair packet block for the first source packet sub-block (1st source packet block), and a time stamp of an FEC source or repair packet that is sent first among FEC source or repair packets included in the FEC source or repair packet block as "13" is set for each FEC source or repair packet included in an FEC source or repair packet block for the second source packet sub-block (2nd source packet block).

A time stamp of an FEC source or repair packet that is sent first among FEC source or repair packets included in the FEC source or repair packet block as "0" is set for each FEC source or repair packet included in an FEC source or repair packet block for a source packet block.

For example, the time stamp is a network time protocol (NTP) time stamp, and may be implemented with a preset number of bytes, e.g., 4 bytes. In this case, upper 2 bytes denotes 'second', and lower 2 bytes denotes 'fraction'. A detailed description of the NTP time stamp may be based on a concept defined in "short-format" in clause 6 of IETF RFC5905, NTP version 4, and a detailed description will be omitted herein.

Although not shown in FIG. 8, another example of a method of sending a time stamp of an FEC source or repair packet that is sent first among FEC source or repair packets included in the FEC source or repair packet block is a scheme of sending a time stamp by including the time stamp to an MMT packet header for each FEC source or repair packet.

Alternatively, the time stamp may be sent through other field which is different from an FEC payload ID.

In any of the various time stamp sending schemes, it is preferred that a time stamp of an FEC source or repair packet that is sent first among FEC source or repair packets included in an FEC source or repair packet block is sent through at least one FEC source or repair packet among FEC source or repair packets included in a related FEC source or repair packet block.

Generally, packet loss may occur on a network. So, if a time stamp is sent in each of all FEC source or repair packets included in a FEC source or repair packet block, a signal receiving apparatus may know a time stamp for an FEC source or repair packet that is sent first among FEC source or repair packets included in a related FEC source or repair packet block from an FEC source or repair packet that the signal receiving apparatus receives first.

Further, a signal receiving apparatus should receive at least one FEC repair packet for FEC decoding. So, if a time stamp for a related FEC source or repair packet in FEC repair packets, the signal receiving apparatus may know a time stamp for an FEC source or repair packet that is sent first among FEC source or repair packets included in a related FEC source or repair packet block from an FEC repair packet that the signal receiving apparatus receives first.

For a two-stage FEC coding structure as described in FIG. 4, if a time stamp is included in each of all FEC source or repair packets included in a related FEC source or repair packet block, an FEC source packet uses two time stamp fields since the FEC source packet should include a time stamp for an FEC source or repair packet that is sent first among FEC source or repair packets included in each of an FEC source or repair packet for an FEC source packet sub-block and an FEC source or repair packet for an FEC source packet block.

In this case, in order to use one field for a time stamp included in an FEC packet, it is possible to alternatively set a time stamp. That is, it is possible that time stamp information for an FEC source or repair packet that is sent first among FEC source or repair packets included in an FEC source or repair packet block for an FEC source packet sub-block is included in an FEC source packet which is odd-numbered sent among FEC source packets, and time stamp information for an FEC source or repair packet that is sent first among FEC source or repair packets included in an FEC source or repair packet block for an FEC source packet block is included in an FEC source packet which is even-numbered sent among the FEC source packets.

Further, in this case, it is preferred that the time stamp field additionally includes information indicating a time stamp for an FEC source or repair packet that is sent first among FEC source or repair packets included in an FEC source or repair packet block for an FEC source packet block or a time stamp for an FEC source or repair packet that is sent first among FEC source or repair packets included in an FEC source or repair packet block for an FEC source packet sub-block. For example, if a time stamp field is implemented with 4 bytes, an MSB 1 bit is set as a time stamp information indicator. In this case, if a value of the 1 bit is "0", it means that a time stamp for an FEC source or repair packet that is sent first among FEC source or repair packets included in an FEC source or repair packet block for an FEC source packet block is sent. If a value of the 1 bit is "1", it means that a time stamp for an FEC source or repair packet that is sent first among FEC source or repair packets included in an FEC source or repair packet block for an FEC source packet sub-block is sent. In this case, the remaining 31 bits are set to the remaining 31 bits except for the MSB 1 bit among the time stamp for FEC source or repair packet that is sent first among FEC source or repair packets included in a related FEC source or repair packet.

A process of setting a time stamp for an FEC source or repair packet that is sent first among FEC source or repair packets included in an FEC source or repair packet block in an MMT system supporting an FEC scheme according to an embodiment of the present disclosure has been described with reference to FIG. 8, and a process of setting a time stamp in a case that a two-stage FEC structure is used in an MMT system supporting an FEC scheme according to an embodiment of the present disclosure will be described with reference to FIG. 9.

Figure 9:
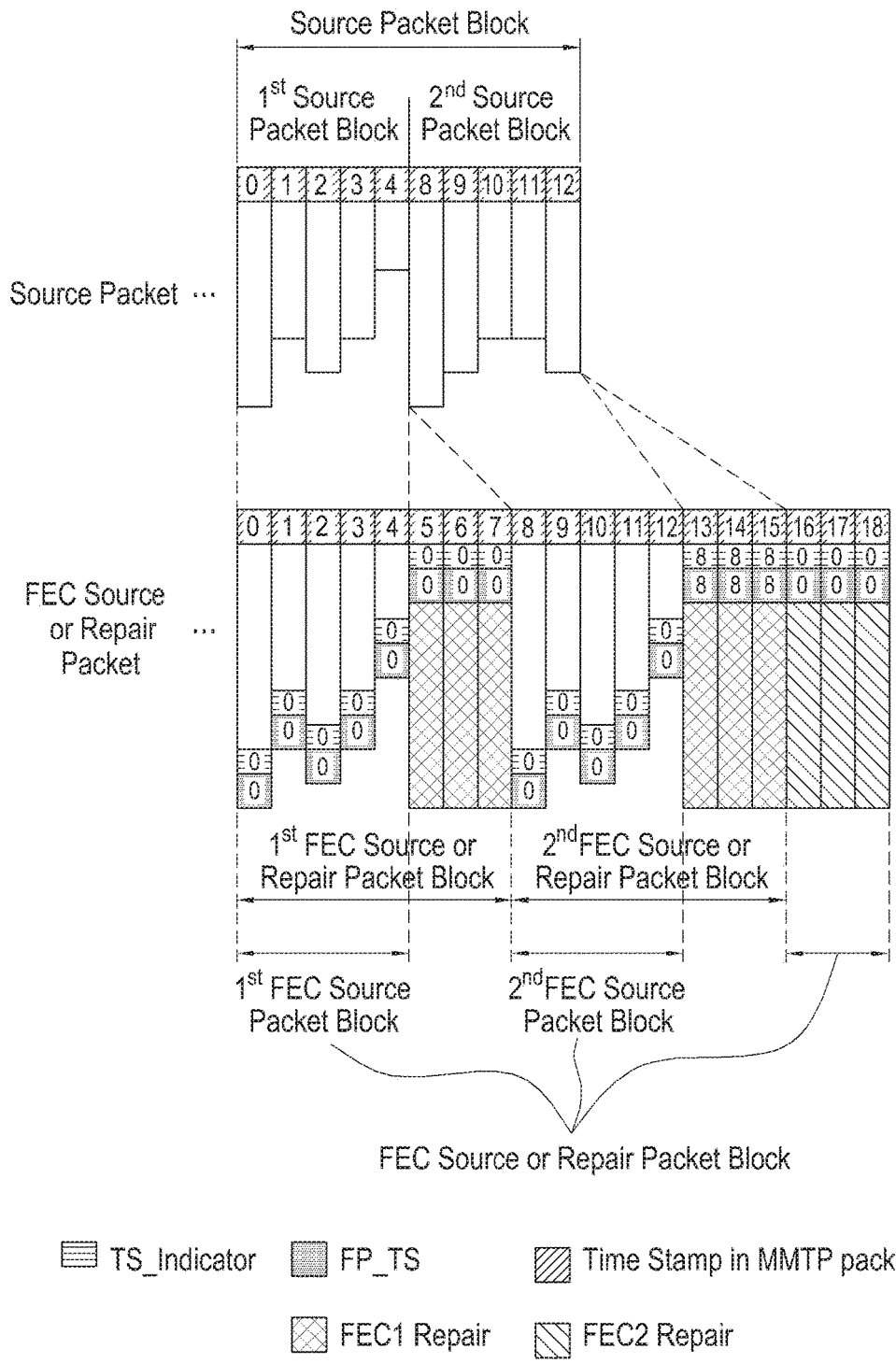
FIG. 9 schematically illustrates a process of setting a time stamp in a case that a two-stage FEC structure is used in an MMT system supporting an FEC scheme according to an embodiment of the present disclosure.

FIG. 9 schematically illustrates a process of setting a time stamp in a case that a two-stage FEC structure is used in an MMT system supporting an FEC scheme according to an embodiment of the present disclosure.

Referring to FIG. 9, a time stamp is set as 0, 1, 2, 3, 4, 8, 9, 10, 11, 12 in an MMTP header included in each of 10 source packets. This means that an AL-FEC processor (not shown in FIG. 10) splits a source packet block including 10 source packets to 5 source packets, respectively, and reserves time stamps 5, 6, 7 for a repair packet after assuming that the an AL-FEC processor will generate 3 repair packets for the first source packet block. The AL-FEC processor determines how to construct a source packet block, or to generate how many repair packets based on FEC configuration related information which is input in MMT sending entity or predetermined, and may schedule each packet according to a sending order and sending time of each packet as described above.

The AL-FEC processor generates 2 source packet sub-blocks (1st source packet blocks), each including 5 source packets, by grouping a source packet block including the 10 source packets, generates 3 FEC 1 repair packets by FEC 1 encoding for each of the two source packet sub-blocks, and generates 3 FEC 2 repair packets by FEC 2 encoding for total source packet blocks.

The AL-FEC processor includes a TS indicator=0 and FP_TS (=0) as 31 bits information except for a most significant bit (MSB) 1 bit of a time stamp which is sent in an MMTP packet header of an FEC source or repair packet that is sent first among FEC source or repair packets included in the first FEC source or repair packet block to a source FEC payload ID of an odd-numbered FEC source packet included in the first FEC source packet block. The TS indicator and the FP_TS will be described below, and a detailed description will be omitted herein.

The AL-FEC processor includes a TS indicator=1 and FP_TS (=0) as 31 bits information except for an MSB 1 bit of a time stamp which is sent in an MMTP packet header of an FEC source or repair packet that is sent first among FEC source or repair packets included in an FEC source or repair packet block to a source FEC payload ID of an even-numbered FEC source packet.

The AL-FEC processor includes a TS indicator=0 and FP_TS (=0) as 31 bits information except for an MSB 1 bit of a time stamp which is sent in an MMTP packet header included in an FEC source or repair packet that is sent first among FEC source or repair packets included in the first FEC source or repair block to 3 FEC1 repair packets for the first FEC source packet block.

The AL-FEC processor includes a TS indicator=0 and FP_TS (=8) as 31 bits information except for an MSB 1 bit of a time stamp which is sent in an MMTP packet header included in an FEC source or repair packet that is sent first among FEC source or repair packets included in the first FEC source or repair block to a source FEC payload ID of an odd-numbered FEC source packet included in the second FEC source packet.

The AL-FEC processor includes a TS indicator=1 and FP_TS (=0) as 31 bits information except for an MSB 1 bit of a time stamp which is sent in an MMTP packet header of an FEC source or repair packet that is sent first among FEC source or repair packets included in an FEC source or repair block to a source FEC payload ID of an even-numbered FEC source packet.

The AL-FEC processor includes a TS indicator=0 and FP_TS (=8) as 31 bits information except for an MSB 1 bit of a time stamp which is sent in an MMTP packet header of an FEC source or repair packet that is sent first among FEC source or repair packets included in an FEC source or repair block to 3 FEC1 repair packets for the second FEC source packet block.

The AL-FEC processor includes a TS indicator=1 and FP_TS (=0) as 31 bits information except for an MSB 1 bit of a time stamp which is sent in an MMTP packet header of an FEC source or repair packet that is sent first among FEC source or repair packets included in an FEC source or repair block to 3 FEC2 repair packets for an FEC source packet block.

A process of setting a time stamp in a case that a two-stage FEC structure is used in an MMT system supporting an FEC scheme according to an embodiment of the present disclosure has been described with reference to FIG. 9, and a structure of an FEC source packet which is used in an MMT system supporting an FEC scheme according to an embodiment of the present disclosure will be described with reference to FIG. 10.

FIG. 10 schematically illustrates a structure of an FEC source packet which is used in an MMT system supporting an FEC scheme according to an embodiment of the present disclosure.

Referring to FIG. 10, the FEC source packet includes a D2 header field 1010, a D1 header field 1011, a D1 payload field 1012, and an FEC in-band signals field 1013.

The D2 header field 1010 includes an MMT packet header, the D1 header field 1011 includes an MMT payload header, the D1 payload field 1012 includes payload data, and the FEC in-band signals field 1013 includes a source FEC payload ID. Here, a time stamp as information on sending time at which a related MMT packet is sent is included in the D2 header field 1010.

A structure of an FEC source packet which is used in an MMT system supporting an FEC scheme according to an embodiment of the present disclosure has been described with reference to FIG. 10, and a structure of an FEC repair packet which is used in an MMT system supporting an FEC scheme according to an embodiment of the present disclosure will be described with reference to FIG. 11.

FIG. 11 schematically illustrates a structure of an FEC repair packet which is used in an MMT system supporting an FEC scheme according to an embodiment of the present disclosure.

Referring to FIG. 11, the FEC repair packet includes a D2 header field 1120, a D1 header field 1121, a D1 payload (repair payload(s)) field 1122, and an FEC in-band signals field 1123.

The D2 header field 1120 includes an MMT packet header, the D1 header field 1121 includes an MMT payload header, the FEC in-band signals field 1123 includes a repair FEC payload ID, and the D1 payload (repair payload(s)) field 1122 includes one or more repair symbols. The D2 header field 1120 includes a time stamp as information on sending time at which a related MMT packet is sent.

As described above, an MMT packet has a structure as described in FIG. 11 through a series of processes such as an FEC encoding process, and the like.

Referring to FIG. 10, in order to maintain consistency of a structure of a protocol packet, e.g., an MMT packet and continuously locate source packets within an FEC packet, it will be assumed that location of the FEC in-band signals field 1013 is the last part of an FEC source packet. The FEC repair packet includes one or more repair symbols. The repair symbols are used for recovering a source symbol block including a source packet.

Referring to FIG. 11, in order for a signal receiving apparatus to more quickly and easily acquire FEC related information, it will be assumed that location of the FEC in-band signals field 1123 is between a sending protocol header and a repair symbol.

A case that a time stamp of an FEC source or repair packet that is sent first among FEC source or repair packets included in an FEC source or repair packet block is included in an FEC payload ID in an MMT system supporting an FEC scheme according to an embodiment of the present disclosure will be described with reference to Tables 1 and 2.

Table 1 expresses a source FEC payload ID, and Table 2 expresses a repair FEC payload ID.

TABLE 1

| SS_ID |
|---|
| FFSRP_TS |

TABLE 2

| SS_Start |
|---|
| RSB_length |
| RS_ID |
| SSB_length |
| FFSRP_TS |

Each field in Tables 1 and 2 will be described below.

(1) SS_ID Field

The SS_ID field includes a source symbol ID (SS_ID), and the SS_ID is a sequence number for source symbols within an FEC source packet.

The SS_ID is incremented per symbol element by a preset value, e.g., 1 from a preset value. This is also applied to a padding symbol element, and the SS_ID is set to an SS_ID of the first symbol element included in an FEC source packet. Difference between an SS_ID for a current packet and an SS_ID for the next packet is identical to the number of symbol elements included in the current packet. However, difference between an SS_ID of the last FEC source packet among FEC source packets included in a current source packet block and an SS_ID of the first FEC source packet among FEC source packets included in the next source packet block is a sum of the number of symbol elements included in the current FEC source packet block and the number of padding symbol elements if the symbol elements is included in a source symbol block of the current FEC source packet block. The SS_ID starts from an arbitrary value which may be randomly generated incremented and the SS_ID wraps around to an initial value, e.g., '0' after a preset maximum value which may be expressed with 4 bytes or a preset length of bytes more than 4 bytes.

The SS_ID will be described below.

The SS_ID may be implemented by a plurality of bits, e.g., 32 bits, and denotes a sequence number for source symbols within an FEC source packet. The SS_ID starts from an arbitrary value incremented and the SS_ID wraps around to an initial value, e.g., '0' after a preset maximum value.

If a value of an ssbg_mode as a parameter indicating an applied SSBG mode is 00 or 01 (ssbg_mode==00 or ssbg_mode==01), the SS_ID is incremented per FEC source packet by a preset value, e.g., one. Here, 'ssbg_mode==00' indicates that the applied SSBG mode is 'ssbg_mode0', and 'ssbg_mode==01' indicates that the applied SSBG mode is 'ssbg_mode1'. The ssbg_mode0 and the ssbg_mode1 will be described below, and a detailed description will be omitted herein.

If the value of the ssbg_mode is 10 (ssbg_mode==10), the SS_ID is incremented per symbol element by a preset value, e.g., one, and the SS_ID is set to an SS_ID of the first symbol element included in the FEC source packet. Here, the symbol element includes padding symbol elements in the last source symbol of the source symbol block if any. Here, 'ssbg_mode==10' indicates that the applied SSBG mode is 'ssbg_mode2'. The ssbg_mode2 will be described below, and a detailed description will be omitted herein.

The ssbg_mode0, the ssbg_mode1, and the ssbg_mode2 will be described below.

Firstly, the ssbg_mode0 will be described below.

In the ssbg_mode0, the source symbol block is the exactly same as the source packet block as all MMTP packets have the same size. This means that the number of MMTP packets included in the source packet block is identical to the number of source symbols included in the source symbol block and each MMTP packet #i is exactly the same as each source symbol #i (i=0, 1, . . . , K−1). In the ssbg_mode0, for a one-stage FEC coding structure (M=1), a source symbol block is generated from a source packet block without padding bytes. In the ssbg_mode0, for a two-stage FEC coding structure and an LA-FEC coding structure (M>1), the ith source symbol block is generated from the ith source packet block included in a source packet block (i=0, 1, . . . , M−1), i.e., the ith source packet sub-block without padding bytes.

Secondly, the ssbg_mode1 will be described below.

In the ssbg_mode1, a source symbol block is generated from a source packet block in the same manner as the ssbg_mode0 except that each MMTP packet #i has possibly padding bytes to make a size of each MMTP packet #i be the same as T used as length of associated parity symbols of each MMTP packet #i. This means that the number of MMTP packets included in the source packet block is the same as the number of source symbols included in a source symbol block associated with the source packet block, and each source symbol #i is generated by adding possible padding bytes (all 00h) to a corresponding MMTP packet #i. In the ssbg_mode1, for a one-stage FEC coding structure (M=1), a source symbol block is generated from a source packet block with possibly padding bytes (all 00h). In the ssbg_mode1, for a two-stage FEC coding structure and an LA-FEC coding structure (M>1), the ith source symbol block is generated from the ith source packet block included in a source packet block (i=0, 1, . . . , M−1) with possibly padding bytes (all 00h).

Thirdly, the ssbg_mode2 will be described below.

In the ssbg_mode2, for a one-stage FEC coding structure, a source symbol block is generated from a source packet block with possibly padding bytes (all 00h). A single source symbol block consists of $K_{SS}$ source symbols generated from a single source packet block with possibly padding bytes (all 00h) and each source symbol consists of the same N (>=1) number of symbol elements. This means that the single source symbol block consists of $N*K_{SS}$ symbol elements. An MMTP packet #0 of the source packet block is placed into the first $s_0$ number of symbol elements included in the source symbol block with possibly padding bytes up to a boundary of the last symbol element of the first $s_0$ number of symbol elements included in the source symbol block. An MMTP packet #1 of the source packet block is placed into the next $s_1$ number of symbol elements included in the source symbol block in the same manner as that of the MMTP packet #0.

In this way, an MMTP packet #$K_{SP}$−1 of the source packet block is placed into the next $S_{K_{Sp}-1}$ number of symbol elements included in the source symbol block in the same manner as that of the MMTP packet #0. If $K_{SS}T$−sum $\{s_iT'$, i=1, . . . , $K_{SP}\}$ is not zero, P number of padding bytes (all 00h) are placed into the last symbol elements included in the single source symbol block.

(2) FFSRP_TS Field

The FFSRP_TS field includes the first FEC source or repair packet time stamp. The FFSRP_TS field is a field for an FEC source packet, and includes a time stamp of an FEC source or repair packet that is sent first among FEC source or repair packets included in a related FEC source or repair packet block including a related packet.

If a two-stage FEC coding structure is applied (M>1 in FIG. 4), the FFSRP_TS field includes both of a time stamp of an FEC source or repair packet that is sent first among FEC source or repair packets included in an FEC source or repair packet block for an FEC source packet sub-block (ith FEC source packet block, i=1, 2, . . . , M) and a time stamp of an FEC source or repair packet that is sent first among FEC source or repair packets included in an FEC source or repair packet block for an FEC source packet block.

Alternatively, if the two-stage FEC coding structure is applied (M>1 in FIG. 3), a time stamp is sent in a form that a time stamp of an FEC source or repair packet that is sent first among FEC source or repair packets included in an FEC source or repair packet block for an FEC source packet sub-block (ith FEC source packet block, i=1, 2, . . . , M) is included in a source FEC payload ID for an FEC source packet which is even-numbered (or odd-numbered) sent among the FEC source packet blocks and a time stamp of an FEC source or repair packet that is sent first among FEC source or repair packets included in an FEC source or repair packet block for an FEC source packet block is included in a source FEC payload ID for an FEC source packet which is odd-numbered (or even-numbered) sent among the FEC source packet blocks, so one FFSRP_TS field may process a two-stage FEC coding structure. In this case, the FFSRP_TS field includes a TS indicator and a time stamp field. The TS indicator indicates that a time stamp included in the time stamp field is for an FEC source or repair packet that is sent first among FEC source or repair packets included in an FEC source or repair packet block for an FEC source packet sub-block or an FEC source or repair packet that is sent first among FEC source or repair packets included in an FEC source or repair packet block for an FEC source packet block.

Alternatively, if an LA-FEC coding structure is applied, the FFSRP_TS field includes a time stamp of an FEC source or repair packet that is sent first among FEC source or repair packets included in a related FEC source or repair packet block including an enhanced layer.

(3) SS_Start Field

The SS_Start field may be selectively used in an FEC source packet. If the SS_Start field is included in the FEC source packet, the SS_Start field has the same value as an SS_ID of the first source packet of a source packet block included in the FEC source packet, and corresponds boundary information of a source symbol block in which the source packet is included.

In an FEC parity packet, the SS_Start field has the same value as an SS_ID of the first source packet of an FEC source packet block related to an FEC parity packet block including a related FEC parity packet. A signal receiving may know a boundary of an FEC source packet, i.e., a start position from a received FEC packet based on the SS_Start field.

(4) RSB_Length Field

The RSB_length field denotes the number of parity symbols included in a parity block in which a parity symbol(s) included in an FEC parity packet is included. That is, if P repair symbols are generated from a source symbol block including K source symbols using an FEC encoding scheme, a value of the RSB_length field is set to P.

(5) RS_ID Field

The RS_ID field includes an RS_ID as a serial number for identifying parity symbols included in an FEC parity packet. The RS_ID starts with a preset value, e.g., 0 and is incremented by a preset value, e.g., 1 within each parity symbol block. If one FEC parity packet includes a plurality of parity symbols, the RS_ID denotes a minimum value among serial numbers of the plurality of parity symbols.

(6) SSB_Length Field

The number of symbol elements included in a source symbol (sub) block protected by a parity symbol(s) included in an FEC parity packet is set in the SSB_length field. The number of symbol elements does not include the number of padding symbol elements included in the last source symbol of the source symbol block. That is, if the number of source symbols included in a source symbol block is K, and the number of padding symbol elements included in the last source symbol among the source symbols included in the source symbol block is p, a value of the SSB_length field is set to K*m−p.

(7) FFSRP_TS Field

The FFSRP_TS field includes the first FEC source or repair packet time stamp. The FFSRP_TS field is for an FEC repair packet, and includes a time stamp of an FEC source or repair packet that is sent first among FEC source or repair packets included in a related FEC source or repair packet block including the FEC repair packet.

Table 3 expresses a case that a time stamp of an FEC source or repair packet that is sent first among FEC source or repair packets included in an FEC source or repair packet block according to an embodiment of the present disclosure is included in an separate field, and the separate field is included in an FEC in-band signal field as described in FIGS. 10 and 11. In this case, the FEC in-band signal field in FIGS. 10 and 11 includes a field for an FEC payload ID and a field for an FEC time stamp, a source FEC payload ID includes an SS_ID field in Table 1, and a repair FEC payload ID is generated without an FFSRP_TS field in Table 2.

TABLE 3

| FFSRP_TS |
|---|

Table 2 is identical to Table 1 except that an FFSRP_TS field in Table 3 is included in an FEC in-band signal field as a separate field not an FEC payload ID. That is, if the FFSRP_TS field is applied to an FEC source packet, the FFSRP_TS field is the same as described in Table 1, and if the FFSRP_TS field is applied to an FEC repair packet, the FFSRP_TS field is the same as described in Table 2.

Table 4 expresses a case that a time stamp of an FEC source or repair packet that is sent first among FEC source or repair packets included in an FEC source or repair packet block according to an embodiment of the present disclosure is included in an MMTP packet header.

TABLE 4

| TS |
|---|
| FFSRP_TS |

In Table 4, a TS field includes a time stamp at which a related packet is sent. Here, a signal receiving apparatus may know time at which a received packet is sent based on the time stamp included in the TS field upon receiving the packet.

In Table 4, an FFSRP_TS field is identical to an FFSRP_TS field in Tables 1 and 2 except that the FFSRP_TS field is included in an MMT packet header, and a detailed description will be omitted herein.

Table 5 expresses a format of an FEC message according to an embodiment of the present disclosure, and the FEC message includes an FEC protection window time field as sending time period information of an FEC source or repair packet block.

TABLE 5

| FEC protection window time |
|---|

In Table 5, an FEC protection window time field denotes a maximum value between sending time of an FEC source or repair packet that is sent first among FEC source or repair packets included in an FEC source or repair packet block and sending time of an FEC source or repair packet which is lastly sent among FEC the source or repair packets included in the FEC source or repair packet block. It means that a signal receiving apparatus should send all FEC source or repair packets included in an FEC source or repair packet block during time set by the FEC protection window time.

So, if the time stamp of the FEC source or repair packet which is lastly sent among the FEC source or repair packets included in the FEC source or repair packet block is 'T1', and the time stamp of the FEC source or repair packet that is sent first among the FEC source or repair packets included in the FEC source or repair packet block is 'T0', a criterion of T1−T0<FEC protection window time should be satisfied.

If a two-stage FEC coding structure or an LA-FEC coding structure is applied, FEC protection window time needs to be set to FEC protection window time for each FEC encoding stage or FEC protection window time for each layer. For example, for the two-stage FEC coding structure, there may be a need for FEC protection window time of an FEC source or repair packet block for an FEC source packet sub-block and FEC protection window time for an FEC source or repair packet block for an FEC source packet block, respectively.

Table 6 expresses a format of an HRBM message according to an embodiment of the present disclosure, and a maximum buffer size field and a fixed end-to-end delay field.

TABLE 6

| Maximum Buffer Size |
|---|
| Fixed End-to-End Delay |

In Table 6, the maximum buffer size field includes a buffer size which is maximally required for MMT assets for a signal receiving apparatus. The buffer size may be calculated as (Maximum delay−Minimum delay)*Maximum Bitrate. That is, the maximum buffer size field includes information related to a maximum buffer size which is required for multimedia data.

In Table 6, the fixed end-to-end delay field includes a delay value between a signal sending apparatus and a signal receiving apparatus, and may be set to a value of maximum transmission delay+FEC buffering time. The FEC buffering time denotes FEC protection window time. As described in FIG. 5, if the FEC protection window time is necessary per an encoding scheme, the HRBM message includes maximum transmission delay information instead of fixed end-to-end delay information, and fixed end-to-end delay information per stage of an encoding scheme for an FEC message may be sent to a signal receiving apparatus along with FEC protection window time per stage of the encoding scheme for the FEC message.

That is, the fixed end-to-end delay field includes information related to delay between the signal sending apparatus and the signal receiving apparatus. The information related to the delay between the signal sending apparatus and the signal receiving apparatus is determined based on maximum sending delay between the signal sending apparatus and the signal receiving apparatus and maximum time interval information. If an FEC source or repair packet block includes a plurality of FEC source or repair packets, the maximum time interval information is related to a maximum time interval between a sending timing point of an FEC source or repair packet that is sent first among the FEC source or repair packets and a sending timing point of an FEC source or repair packet which is lastly sent among the FEC source or repair packets.

If an FEC source or repair packet block includes a plurality of FEC source or repair packets, the FEC protection window time denotes information related to a maximum time interval between a sending timing point of an FEC source or repair packet that is sent first among the FEC source or repair packets and a sending timing point of an FEC source or repair packet which is lastly sent among the FEC source or repair packets. The FEC source or repair packets are sent to a receiving apparatus within the maximum time interval.

A sending/receiving period of an FEC source or repair packet block and an FEC decoding de-jittering process in an MMT system supporting an FEC scheme according to an embodiment of the present disclosure will be described below.

Figure 12:
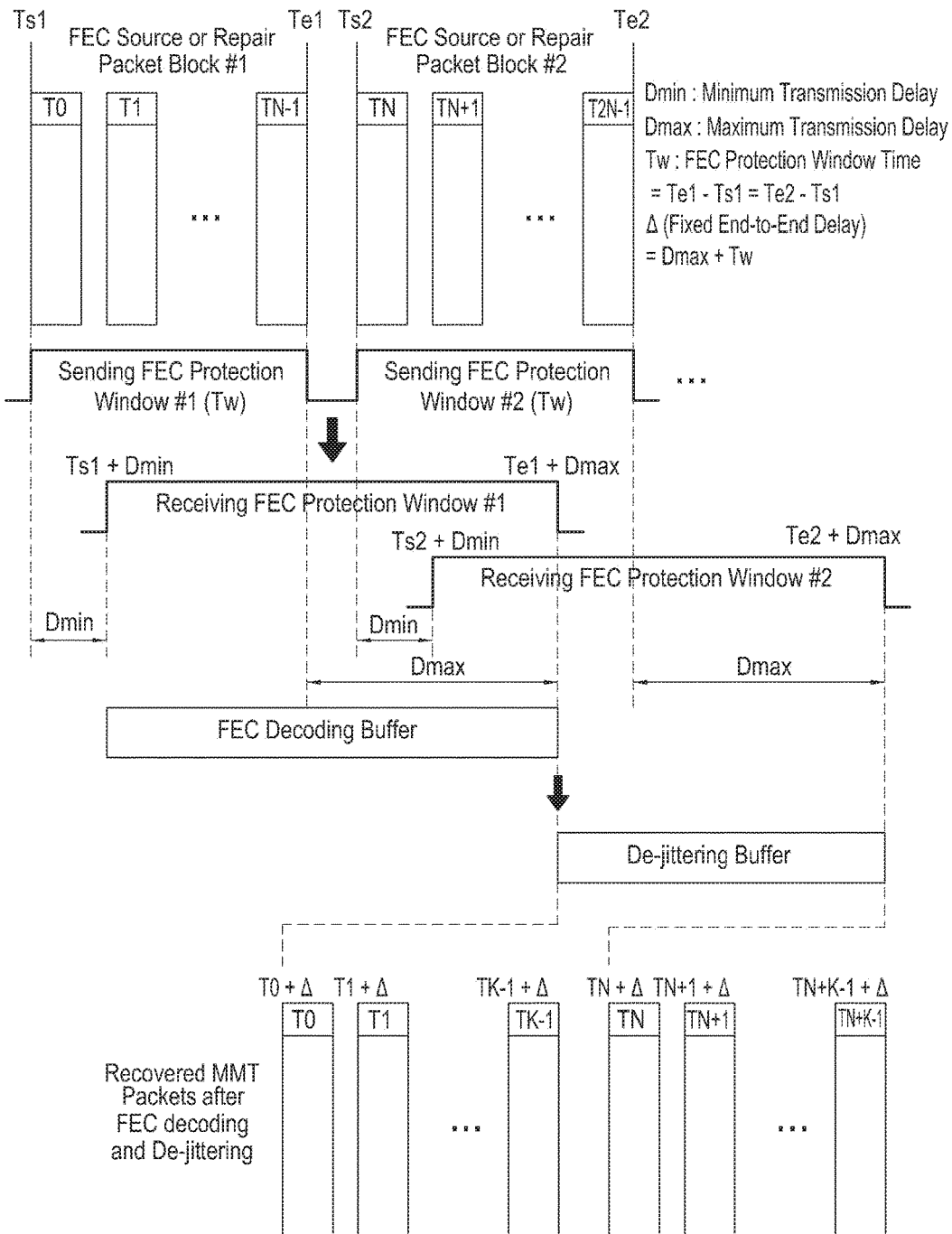
FIG. 12 schematically illustrates a sending/receiving period of an FEC source or repair packet block and an FEC decoding de-jittering process in an MMT system supporting an FEC scheme according to an embodiment of the present disclosure.

FIG. 12 schematically illustrates a sending/receiving period of an FEC source or repair packet block and an FEC decoding de-jittering process in an MMT system supporting an FEC scheme according to an embodiment of the present disclosure.

Referring to FIG. 12, an MMTP sends the first FEC source or repair packet to the last FEC source or repair packet included in an FEC source or repair packet block within an FEC Protection Window Time (Tw) based on a sending order. In FIG. 12, 2 FEC source or repair packet blocks, each including N packets (K FEC source packets and N-K FEC repair packets), are sent using FEC protection window time (Tw) set in an FEC message. The sent N packets arrive at a signal receiving apparatus after minimum transmission delay (Dmin) or maximum transmission delay (Dmax) due to network delay.

So, an FEC protection window at a sending timing point may be different from FEC protection window at a receiving timing point. That is, an FEC source or repair packet block #1 which is sent between Ts1 and Te1 may have a receiving window from Ts1+Dmin to Te1+Dmax due to network delay.

However, due to network situation, packet may not arrive in the same order as an sending order and packet loss may occur, so a signal receiving apparatus may not set a receiving window from Ts1+Dmin to Te1+Dmax since the signal receiving apparatus may not know whether a packet received first is an FEC source or repair packet that is sent first among FEC source or repair packets included in a related FEC source or repair packet.

However, a signal receiving apparatus may set a receiving window from a receiving time of a first received FEC source or repair packet which is based on FFSRP_TS information of the first received FEC source or repair packet, i.e., Tr to T0+Tw+Dmax=Te1+Dmax using FEC protection window time (Tw) of an FEC message, maximum transmission delay (Dmax), and a time stamp of an FEC source or repair packet that is sent first among FEC source or repair packets included in an FEC source or repair packet which is sent in each FEC source or repair packet (i.e., FFSRP_TS=T0=Ts1).

So, the signal receiving apparatus may perform an FEC decoding operation by performing a buffering operation during time from Tr to Te1+Dmax. If the signal receiving apparatus receives sufficient FEC source or repair packets, the signal receiving apparatus may perform an FEC decoding operation before the time from Tr to Te1+Dmax. The Te1+Dmax denotes maximum time during which an FEC decoder by an HRBM may wait for performing a decoding operation. The FEC decoder inputs K MMT packets included in a related FEC source packet block along with MMT packets which are recovered according to FEC decoding to a de-jittering buffer, and the de-jittering buffer outputs the input MMT packets corresponding to Ts+Δ. Here, the Ts denotes a time stamp of a packet, and Δ=Dmax+Tw.

A sending/receiving period of an FEC source or repair packet block and an FEC decoding de-jittering process in an MMT system supporting an FEC scheme according to an embodiment of the present disclosure has been described with reference to FIG. 12, and an inner structure of an HRBM in an MMT system supporting an FEC scheme according to an embodiment of the present disclosure will be described with reference to FIG. 13.

Figure 13:
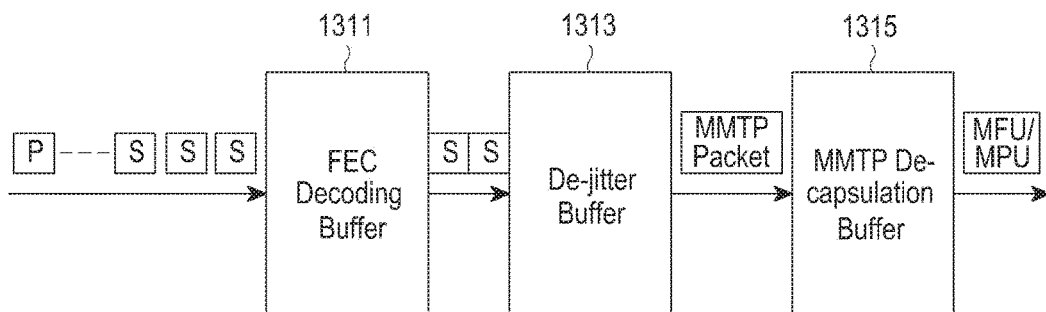
FIG. 13 schematically illustrates an inner structure of an hypothetical receiver buffering model (HRBM) in an MMT system supporting an FEC scheme according to an embodiment of the present disclosure.

FIG. 13 schematically illustrates an inner structure of an HRBM in an MMT system supporting an FEC scheme according to an embodiment of the present disclosure.

Referring to FIG. 13, the HRBM includes a FEC decoding buffer 1311, a de-jittering buffer 1313, and a MMTP de-capsulation buffer 1315. The detailed description of the FEC decoding buffer 1311, the de-jittering buffer 1313, and the MMTP de-capsulation buffer 1315 will be followed.

(1) FEC Decoding Buffer 1311

The FEC decoding buffer 1311 sets a receiving window from a receiving time of a first received FEC source or repair packet Tr to FFRSP_TS+Tw+Dmax=FFRSP+Δ based on FFRSP_TS information for the first received FEC source or repair packet, FEC protection window time Tw of an FEC message, maximum transmission delay Dmax of an HRBM message, and a maximum buffer size, and buffers FEC source or repair packets included in a related FEC source or repair packet block which are received within the set receiving window.

After receiving sufficient FEC source or repair packets within the receiving window, the signal receiving apparatus performs an FEC decoding operation before FFRSP+Δ or at FFRSP+Δ, and inputs all packets (MMT packets) of a recovered FEC source packet block to the de-jittering buffer 1313. That is, all packets included in the recovered FEC source packet are input to the de-jittering buffer 1313 at a timing point T+FEC protection window time (Tw). Here, the T is less than or equal to FFRSP_TS+Dmax or greater than or equal to a timing point at which the signal receiving apparatus receives sufficient FEC source or repair packets which the signal receiving apparatus may FEC decode.

(2) De-Jittering Buffer 1313

The de-jittering buffer 1313 inputs each of the MMT packets input from the FEC decoding buffer 1311 at a timing point Ts+Δ to the MMTP de-capsulation buffer 1315. Here, the Ts is sending time of a packet included in a header of an MMT packet, i.e., a time stamp.

(3) MMTP De-Capsulation Buffer 1315

The MMTP de-capsulation buffer 1315 by performing a de-capsulation operation on the MMT packets input from the de-jittering buffer 1313 to generate media fragment unit (MFU)/media processing unit (MPU), and outputs the generated MFU/MPU. Here, the MFU denotes a fragment of an MPU. The de-capsulation operation includes an operation of removing an MMT packet header and an MMT payload header, an operation of removing an MMT payload, a de-fragmentation operation, and a de-aggregation.

Although the FEC decoding buffer 1311, the de-jittering buffer 1313, and the MMTP de-capsulation buffer 1315 are described as separate units, it is to be understood that this is merely for convenience of description. In other words, two or more of the FEC decoding buffer 1311, the de-jittering buffer 1313, and the MMTP de-capsulation buffer 1315 may be incorporated into a single unit.

An inner structure of an HRBM in an MMT system supporting an FEC scheme according to an embodiment of the present disclosure will be described with reference to FIG. 13, and an FEC protection window in a signal receiving apparatus in a case that an FFRST_TS is sent after being included in a packet (Case 1) and an FEC protection window in a signal receiving apparatus in a case that an FFRST_TS is sent without being included in a packet (Case 2) in an MMT system supporting an FEC scheme according to an embodiment of the present disclosure will be described with reference to FIG. 14.

Figure 14:
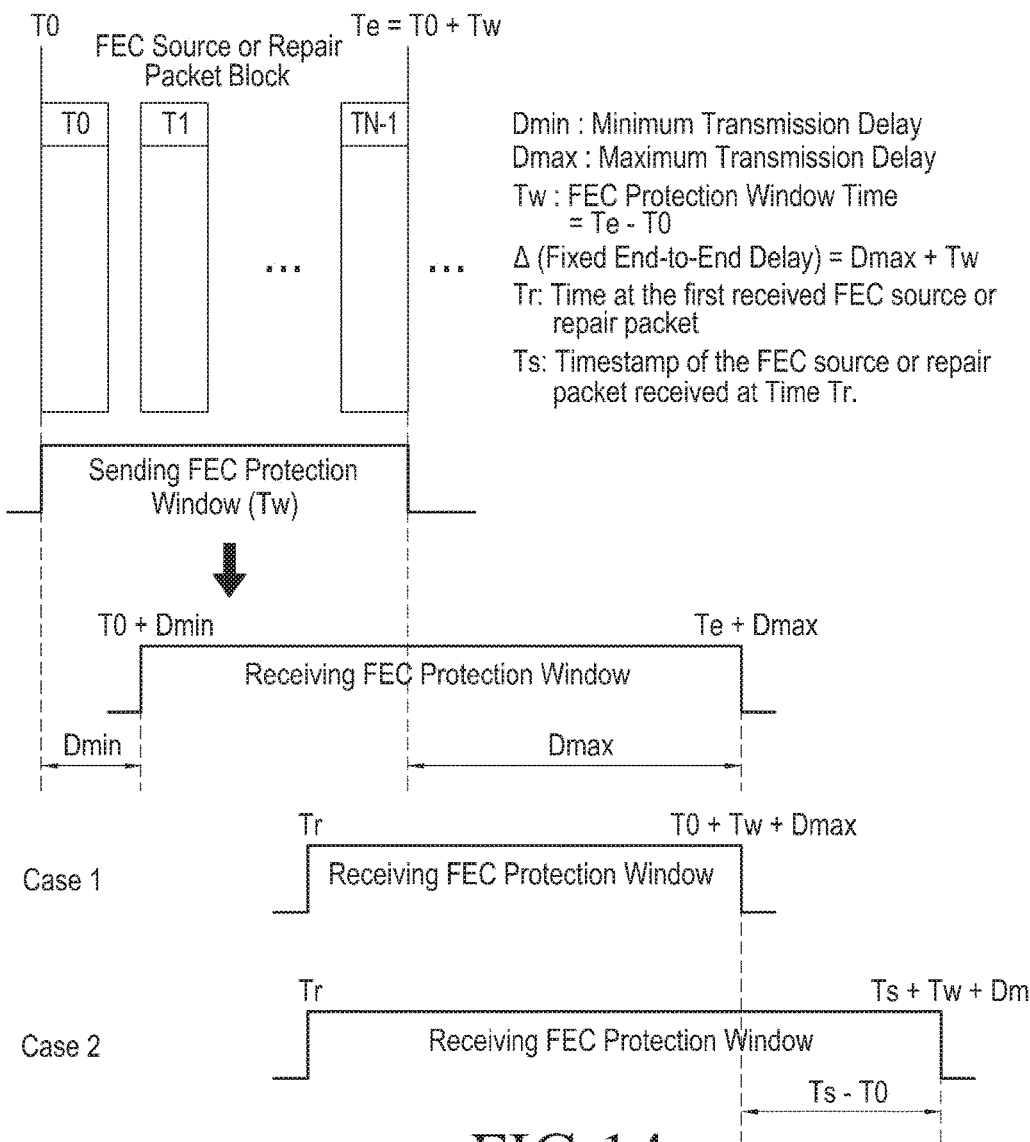
FIG. 14 schematically illustrates an FEC protection window in a signal receiving apparatus in a case that an FFRST_TS is sent after being included in a packet (Case 1) and an FEC protection window in a signal receiving apparatus in a case that an FFRST_TS is sent without being included in a packet (Case 2) in an MMT system supporting an FEC scheme according to an embodiment of the present disclosure.

FIG. 14 schematically illustrates an FEC protection window in a signal receiving apparatus in a case that an FFRST_TS is sent after being included in a packet (Case 1) and an FEC protection window in a signal receiving apparatus in a case that an FFRST_TS is sent without being included in a packet (Case 2) in an MMT system supporting an FEC scheme according to an embodiment of the present disclosure.

Referring to FIG. 14, a receiving FEC protection window interval which is expressed as T0+Dmin~Te+Dmax denotes an interval in which a sent FEC source or repair packet block may be received by considering Dmin, Dmax, and Tw.

Referring to FIG. 14, referring to a Case 1, a signal receiving apparatus first receives an FEC source or repair packet included in the FEC source or repair packet at actual time Tr. According to an embodiment of the present disclosure, an FEC protection window of the signal receiving apparatus is set from FFRSP_TS information (T0) included in the received FEC source or repair packet to T0+Tw+Dmax by considering Tw, and Dmax which are acquired from an FEC message and an HRBM message.

Referring to FIG. 14, referring to a Case 2, an FFRSP_TS proposed in an embodiment of the present disclosure is not sent, so the signal receiving apparatus does not know sending time information of an FEC source or repair packet that is sent first among FEC source or repair packets included in the FEC source or repair packet block and may not know whether a first received FEC source or repair packet is the FEC source or repair packet that is sent first among the FEC source or repair packets included in the FEC source or repair packet block.

Due to this, the signal receiving apparatus should set the FEC protection window of the signal receiving apparatus to Ts+Tw+Dmax by considering Tw and Tmax based on sending time information (Ts) of the first received FEC source or repair packet.

Due to this, in the Case 2 compared with the Case 1, the signal receiving apparatus performs unnecessary buffering operation during Ts–T0, or additional delay occurs, and output time of a de-jittering buffer may be varied according that an FEC decoding buffer firstly receives which FEC source or repair packet since a value of Ts–T0 is varied according to sending time information Ts of a first received FEC source or repair packet.

An FEC protection window in a signal receiving apparatus in a case that an FFRST_TS is sent after being included in a packet (Case 1) and an FEC protection window in a signal receiving apparatus in a case that an FFRST_TS is sent without being included in a packet (Case 2) in an MMT system supporting an FEC scheme according to an embodiment of the present disclosure has been described with reference to FIG. 14, and an example of an inner structure of an MMT sending entity in an MMT system according to an embodiment of the present disclosure will be described with reference to FIG. 15.

Figure 15:
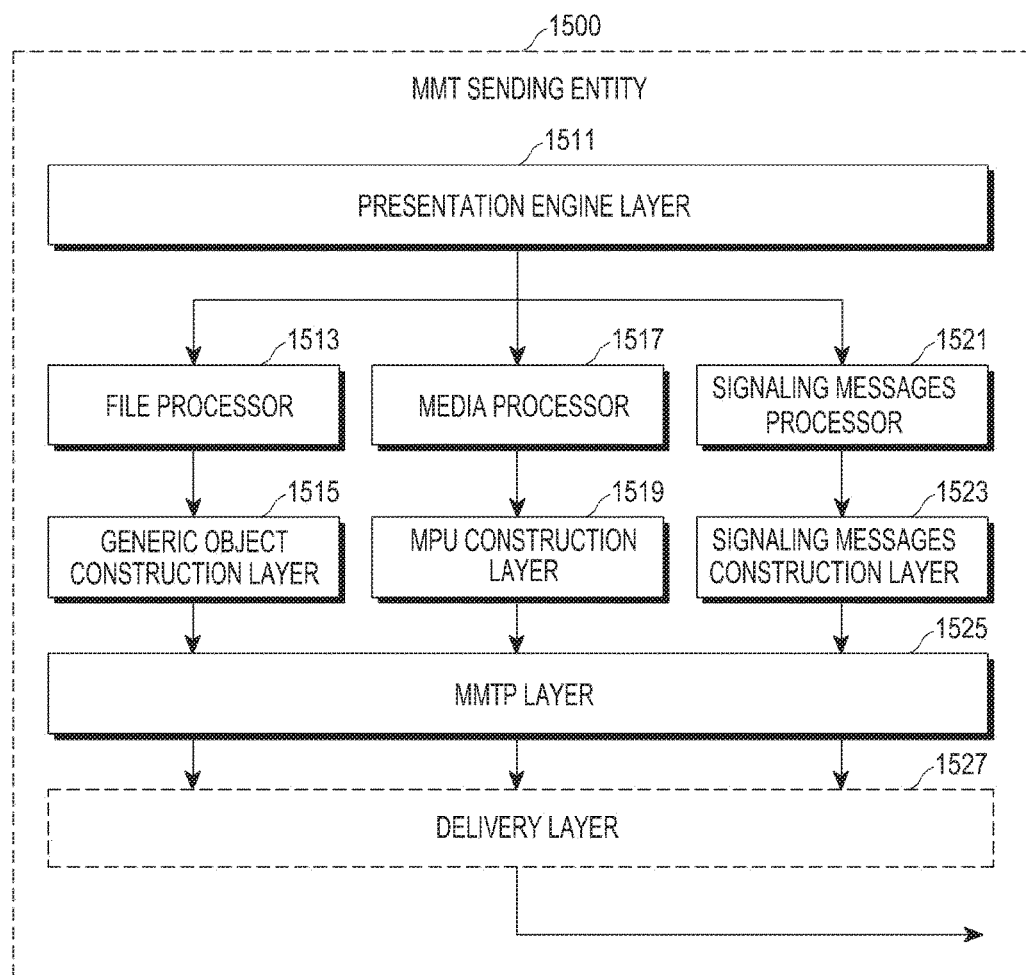
FIG. 15 schematically illustrates an example of an inner structure of an MMT sending entity in an MMT system according to an embodiment of the present disclosure.

FIG. 15 schematically illustrates an example of an inner structure of an MMT sending entity in an MMT system according to an embodiment of the present disclosure.

Referring to FIG. 15, an MMT sending entity 1500 includes a presentation engine layer 1511, a file processor 1513, a generic object construction layer 1515, a media processor 1517, an MPU construction layer 1519, a signaling messages processor 1521, a signaling messages construction layer 1523, an MMTP layer 1525, and a delivery layer 1527.

The presentation engine layer 1511 sets up a multimedia scene.

The file processor 1513 processes a file, e.g., an MPU file, and the generic object construction layer 1515 constructs a generic object such as a complete MPU.

The media processor 1517 processes media data, the MPU construction layer 1519 constructs an MPU, and the signaling messages processor 1521 performs a processing operation for a signaling message to be sent to an MMT receiving entity. The signaling messages construction layer 1523 constructs a signal message which is processed in the signaling messages processor 1521.

The MMTP layer 1525 generates streamed media by considering various parameters such as a packet_id, a payload type, and the like. Here, an encapsulation procedure is based on a delivered payload type, and is independently performed, so it will be noted that the encapsulation procedure is not shown in FIG. 15.

The delivery layer 1527 converts the streamed media data which is generated in the MMTP layer 1525 to a format which is appropriate for the delivery layer 1527 to send the streamed media data, and sends the converted form to the MMT receiving entity.

Although the presentation engine layer 1511, the file processor 1513, the generic object construction layer 1515, the media processor 1517, the MPU construction layer 1519, the signaling messages processor 1521, the signaling messages construction layer 1523, the MMTP layer 1525, and the delivery layer 1527 are described as separate units, it is to be understood that this is merely for convenience of description. In other words, two or more of the presentation engine layer 1511, the file processor 1513, the generic object construction layer 1515, the media processor 1517, the MPU construction layer 1519, the signaling messages processor 1521, the signaling messages construction layer 1523, the MMTP layer 1525, and the delivery layer 1527 may be incorporated into a single unit.

An example of an inner structure of an MMT sending entity in an MMT system supporting an FEC scheme according to an embodiment of the present disclosure has been described with reference to FIG. 15, and another example of an inner structure of an MMT sending entity in an MMT system supporting an FEC scheme according to an embodiment of the present disclosure will be described with reference to FIG. 16.

Figure 16:
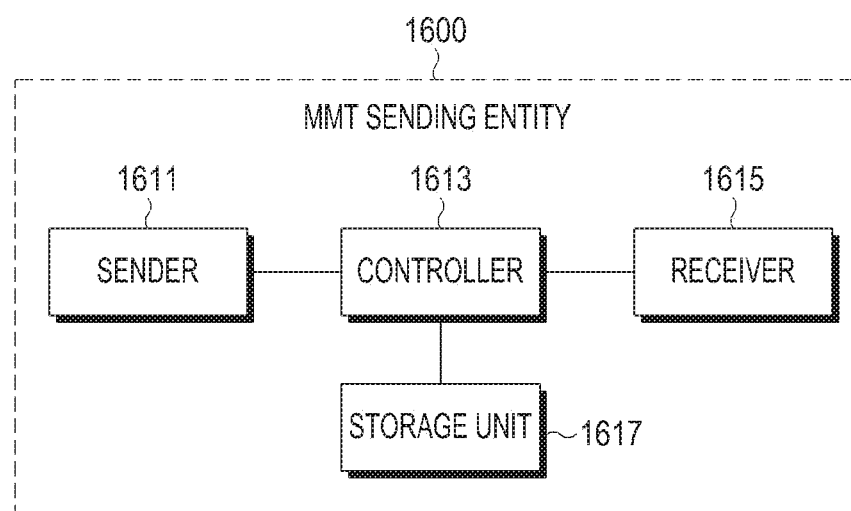
FIG. 16 schematically illustrates another example of an inner structure of an MMT sending entity in an MMT system according to an embodiment of the present disclosure.

FIG. 16 schematically illustrates another example of an inner structure of an MMT sending entity in an MMT system according to an embodiment of the present disclosure.

Referring to FIG. 16, an MMT sending entity 1600 includes a sender 1611, a controller 1613, a receiver 1615, and a storage unit 1617.

The controller 1613 controls the overall operation of the MMT sending entity 1600. More particularly, the controller 1613 controls the MMT sending entity 1600 to perform an operation related to an operation of sending/receiving a packet according to an embodiment of the present disclosure. The operation related to the operation of sending/receiving the packet is performed in the manner described with reference to FIGS. 1 to 14 and a description thereof will be omitted herein.

The sender 1611 sends various messages, and/or the like to an MMT receiving entity, and/or the like under a control of the controller 1613. The various messages, and/or the like sent in the sender 1611 have been described in FIGS. 1 to 14 and a description thereof will be omitted herein.

The receiver 1615 receives various messages, and/or the like from the MMT receiving entity, and the like under a control of the controller 1613. The various messages, and the like received in the receiver 1615 have been described in FIGS. 1 to 14 and a description thereof will be omitted herein.

The storage unit 1617 stores a program, various data, and/or the like necessary for the operation of the MMT sending entity 1600, specially, the operation related to the operation of sending/receiving the packet according to an embodiment of the present disclosure. The storage unit 1617 stores the various messages, and/or the like received in the receiver 1615.

Although the sender 1611, the controller 1613, the receiver 1615, and the storage unit 1617 are described as separate units, it is to be understood that this is merely for convenience of description. In other words, two or more of the sender 1611, the controller 1613, the receiver 1615, and the storage unit 1617 may be incorporated into a single unit.

Another example of an inner structure of an MMT sending entity in an MMT system according to an embodiment of the present disclosure has been described with reference to FIG. 16, and an example of an inner structure of an MMT receiving entity in an MMT system according to an embodiment of the present disclosure will be described with reference to FIG. 17.

Figure 17:
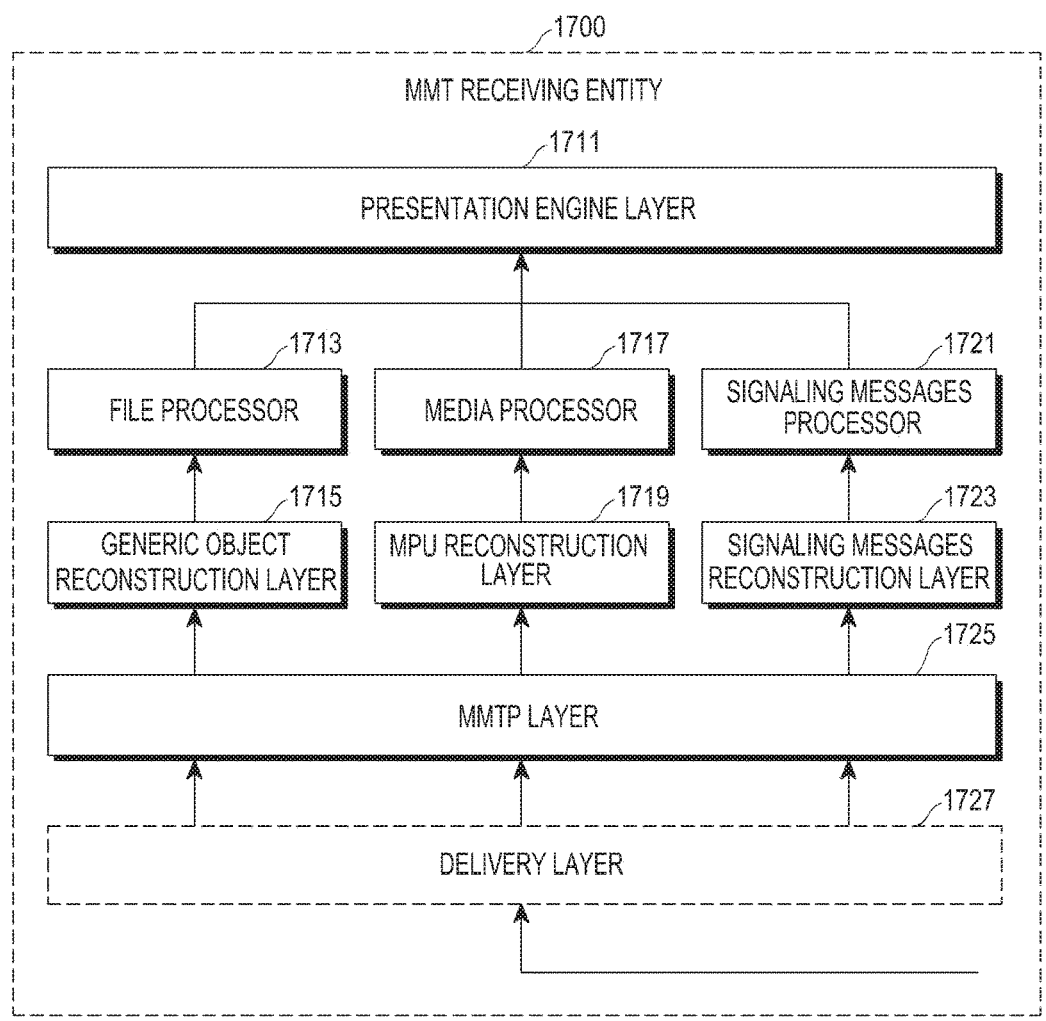
FIG. 17 schematically illustrates an example of an inner structure of an MMT receiving entity in an MMT system according to an embodiment of the present disclosure.

FIG. 17 schematically illustrates an example of an inner structure of an MMT receiving entity in an MMT system according to an embodiment of the present disclosure.

Referring to FIG. 17, an MMT receiving entity 1700 includes a presentation engine layer 1711, a file processor 1713, a generic object reconstruction layer 1715, a media processor 1717, an MPU reconstruction layer 1719, a signaling messages processor 1721, a signaling messages reconstruction layer 1723, an MMTP layer 1725, and a delivery layer 1727.

The MMT receiving entity 1700 operates at one or more MMT functional areas (not shown in FIG. 17). The MMT functional areas include an MPU functional area, a delivery functional area, and a signaling functional area. The MPU functional area, the delivery functional area, and the signaling functional area will be described below.

The MPU functional area defines a logical structure of media content, a package, and a format of data units to be processed by an MMT entity and their instantiation, e.g., instantiation with ISO base media file format as specified in ISO/IEC 14496-12. The package specifies components including the media content and relationship among the components to provide necessary information for advanced delivery. The format of the data units is defined to encapsulate encoded media data for either storage or delivery, and to allow for easy conversion between data to be stored and data to be delivered.

The delivery functional area defines an application layer transport protocol and payload formats. The application layer transport protocol provides enhanced characteristics compared with multiplexing, support of mixed use of streaming, and download delivery in a general application layer transport protocol, e.g., a single packet flow. The payload format is defined in order to enable to carry encoded media date which is agnostic to media types and encoding methods.

The signaling functional area defines formats of signaling messages carrying information for managing media content delivery and consumption. Signaling messages for managing consumption are used for signaling a structure of the package, and signaling messages for managing delivery are used for signaling a structure of the payload format and protocol configuration.

The MMTP layer 1725 is used to receive and de-multiplex streamed media based on various parameters such as a packet_id, a payload type, and the like. Here, a de-capsulation procedure depends on a type of a payload that is delivered and is independently processed, and thus is not shown in FIG. 17.

The presentation engine layer 1711 sets up a multimedia scene, and refers to a content that is received using an MMTP.

Although the presentation engine layer 1711, the file processor 1713, the generic object reconstruction layer 1715, the media processor 1717, the MPU reconstruction layer 1719, the signaling messages processor 1721, the signaling messages reconstruction layer 1723, the MMTP layer 1725, and the delivery layer 1727 are described as separate units, it is to be understood that this is merely for convenience of description. In other words, two or more of the presentation engine layer 1711, the file processor 1713, the generic object reconstruction layer 1715, the media processor 1717, the MPU reconstruction layer 1719, the signaling messages processor 1721, the signaling messages reconstruction layer 1723, the MMTP layer 1725, and the delivery layer 1727 may be incorporated into a single unit.

An example of an inner structure of an MMT receiving entity in an MMT system according to an embodiment of the present disclosure has been described with reference to FIG. 17, and another example of an inner structure of an MMT receiving entity in an MMT system according to an embodiment of the present disclosure will be described with reference to FIG. 18.

Figure 18:
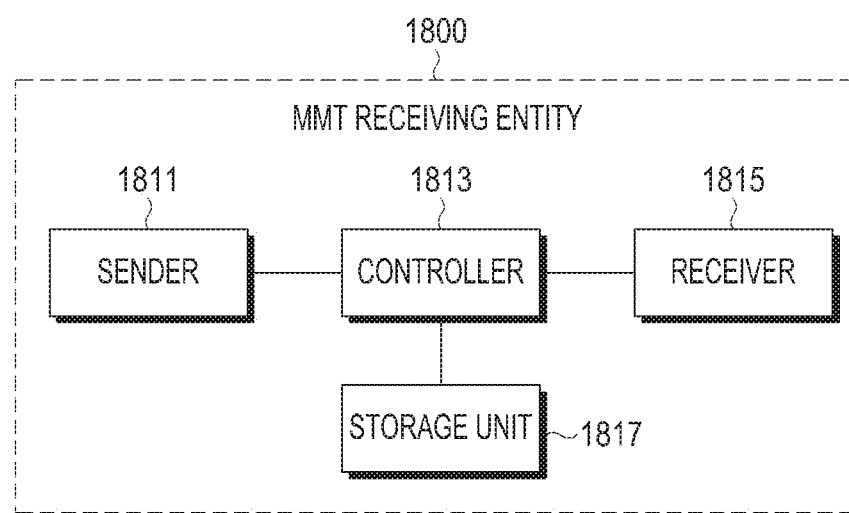
FIG. 18 schematically illustrates another example of an inner structure of an MMT receiving entity in an MMT system according to an embodiment of the present disclosure.

FIG. 18 schematically illustrates another example of an inner structure of an MMT receiving entity in an MMT system according to an embodiment of the present disclosure.

Referring to FIG. 18, an MMT receiving entity 1800 includes a sender 1811, a controller 1813, a receiver 1815, and a storage unit 1817.

The controller 1813 controls the overall operation of the MMT receiving entity 1800. More particularly, the controller 1813 controls the MMT receiving entity 1800 to perform an operation related to an operation of sending/receiving a packet according to an embodiment of the present disclosure. The operation related to the operation of sending/receiving the packet is performed in the manner described with reference to FIGS. 1 to 14 and a description thereof will be omitted herein.

The sender 1811 sends various messages, and/or the like to an MMT sending entity, and/or the like under a control of the controller 1813. The various messages, and/or the like sent in the sender 1811 have been described in FIGS. 1 to 14 and a description thereof will be omitted herein.

The receiver 1815 receives various messages, and/or the like from the MMT sending entity, and the like under a control of the controller 1813. The various messages, and the like received in the receiver 1815 have been described in FIGS. 1 to 14 and a description thereof will be omitted herein.

The storage unit 1817 stores a program, various data, and/or the like necessary for the operation of the MMT receiving entity 1800, specially, the operation related to the operation of sending/receiving the packet according to an embodiment of the present disclosure. The storage unit 1817 stores the various messages, and/or the like received in the receiver 1815.

Although the sender 1811, the controller 1813, the receiver 1815, and the storage unit 1817 are described as separate units, it is to be understood that this is merely for convenience of description. In other words, two or more of the sender 1811, the controller 1813, the receiver 1815, and the storage unit 1817 may be incorporated into a single unit.

Certain aspects of the present disclosure may also be embodied as computer readable code on a non-transitory computer readable recording medium. A non-transitory computer readable recording medium is any data storage device that can store data, which can be thereafter read by a computer system. Examples of the non-transitory computer readable recording medium include read-only memory (ROM), random-access memory (RAM), compact disk read-only memory (CD-ROMs), magnetic tapes, floppy disks, optical data storage devices, and carrier waves (such as data transmission through the Internet). The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

It can be appreciated that a method and apparatus according to an embodiment of the present disclosure may be implemented by hardware, software and/or a combination thereof. The software may be stored in a non-volatile storage, for example, an erasable or re-writable ROM, a memory, for example, a RAM, a memory chip, a memory device, or a memory integrated circuit (IC), or an optically or magnetically recordable non-transitory machine-readable (e.g., computer-readable), storage medium (e.g., a compact disk (CD), a digital versatile disk (DVD), a magnetic disk, a magnetic tape, and/or the like). A method and apparatus according to an embodiment of the present disclosure may be implemented by a computer or a mobile terminal that includes a controller and a memory, and the memory may be an example of a non-transitory machine-readable (e.g., computer-readable), storage medium suitable to store a program or programs including instructions for implementing various embodiments of the present disclosure.

The present disclosure may include a program including code for implementing the apparatus and method as defined by the appended claims, and a non-transitory machine-readable (e.g., computer-readable), storage medium storing the program. The program may be electronically transferred via any media, such as communication signals, which are transmitted through wired and/or wireless connections, and the present disclosure may include their equivalents.

An apparatus according to an embodiment of the present disclosure may receive the program from a program providing device which is connected to the apparatus via a wire or a wireless and store the program. The program providing device may include a memory for storing instructions which instruct to perform a content protect method which has been already installed, information necessary for the content protect method, and the like, a communication unit for performing a wired or a wireless communication with a graphic processing device, and a controller for transmitting a related program to a transmitting/receiving device based on a request of the graphic processing device or automatically transmitting the related program to the transmitting/receiving device.

While the present disclosure has been shown and described with reference to various embodiments thereof, it will be understood by those skilled in the art that various changes in form and details may be made therein without departing from the spirit and scope of the present disclosure as defined by the appended claims and their equivalents.

The invention claimed is:

1. A method for sending forward error correction (FEC) configuration information by a sending apparatus in a multimedia system, the method comprising:
generating FEC configuration information for an FEC packet; and
sending the FEC configuration information,
wherein the FEC configuration information includes information related to a first FEC packet that is sent first among FEC packets if an FEC packet block includes the FEC packets, and
wherein the information related to the first FEC packet includes a value for remaining bits, which exclude a most significant bit (MSB) 1 bit of a time stamp (TS) included in a packet header of the first FEC packet.

2. The method of claim 1, wherein the sending apparatus supports a one-stage FEC coding structure.

3. The method of claim 1, wherein the sending apparatus supports a layer aware-forward error correction (LA-FEC) coding structure.

4. The method of claim 1, wherein, if the sending apparatus supports a two-stage FEC coding structure, the FEC configuration information includes a TS indicator indicating the information related to the first FEC packet is for the FEC packet block of the two-stage FEC coding structure.

5. The method of claim 4, wherein the TS indicator is set to a first value for FEC packets which are odd-numbered sent among FEC packets included in a first FEC packet block, or wherein the TS indicator is set to a second value for FEC packets which are even-numbered sent among the FEC packets included in the first FEC packet block.

6. The method of claim 1, wherein the first FEC packet includes an FEC source packet or an FEC repair packet.

7. The method of claim 5, wherein the first FEC packet block includes an FEC source packet block.

* * * * *